United States Patent
Stuber et al.

(10) Patent No.: US 8,466,054 B2
(45) Date of Patent: Jun. 18, 2013

(54) THERMAL CONDUCTION PATHS FOR SEMICONDUCTOR STRUCTURES

(75) Inventors: Michael A. Stuber, Carlsbad, CA (US); Chris Brindle, Poway, CA (US); Stuart B. Molin, Carlsbad, CA (US)

(73) Assignee: IO Semiconductor, Inc., San Diego, CA (US)

(*) Notice: Subject to any disclaimer, the term of this patent is extended or adjusted under 35 U.S.C. 154(b) by 0 days.

(21) Appl. No.: 13/311,454

(22) Filed: Dec. 5, 2011

(65) Prior Publication Data
US 2012/0146193 A1    Jun. 14, 2012

Related U.S. Application Data

(60) Provisional application No. 61/422,650, filed on Dec. 13, 2010.

(51) Int. Cl.
*H01L 21/44* (2006.01)

(52) U.S. Cl.
USPC .............. 438/598; 438/599; 257/E21.122

(58) Field of Classification Search
USPC .................... 438/598, 599; 257/E21.122
See application file for complete search history.

(56) References Cited

U.S. PATENT DOCUMENTS

| | | | |
|---|---|---|---|
| 5,955,781 A | 9/1999 | Joshi et al. | |
| 6,121,661 A | 9/2000 | Assaderaghi et al. | |
| 6,573,565 B2 | 6/2003 | Clevenger et al. | |
| 7,033,927 B2 * | 4/2006 | Cohen et al. | 438/637 |
| 7,541,644 B2 | 6/2009 | Hirano et al. | |
| 8,048,794 B2 * | 11/2011 | Knickerbocker | 438/618 |
| 2004/0171226 A1 * | 9/2004 | Burden | 438/347 |
| 2005/0282381 A1 * | 12/2005 | Cohen et al. | 438/637 |
| 2011/0163457 A1 * | 7/2011 | Mohan et al. | 257/774 |
| 2012/0088339 A1 * | 4/2012 | Molin et al. | 438/138 |
| 2012/0129301 A1 * | 5/2012 | Or-Bach et al. | 438/129 |
| 2012/0187412 A1 * | 7/2012 | D'Evelyn et al. | 257/76 |
| 2012/0205725 A1 * | 8/2012 | Nygaard et al. | 257/272 |
| 2012/0217625 A1 * | 8/2012 | Mohan et al. | 257/664 |

FOREIGN PATENT DOCUMENTS

JP        2007235157 A      9/2007

* cited by examiner

*Primary Examiner* — Ngan Ngo
(74) *Attorney, Agent, or Firm* — The Mueller Law Office, P.C.

(57) ABSTRACT

A thermal path is formed in a layer transferred semiconductor structure. The layer transferred semiconductor structure has a semiconductor wafer and a handle wafer bonded to a top side of the semiconductor wafer. The semiconductor wafer has an active device layer formed therein. The thermal path is in contact with the active device layer within the semiconductor wafer. In some embodiments, the thermal path extends from the active device layer to a substrate layer of the handle wafer. In some embodiments, the thermal path extends from the active device layer to a back side external thermal contact below the active device layer.

16 Claims, 12 Drawing Sheets

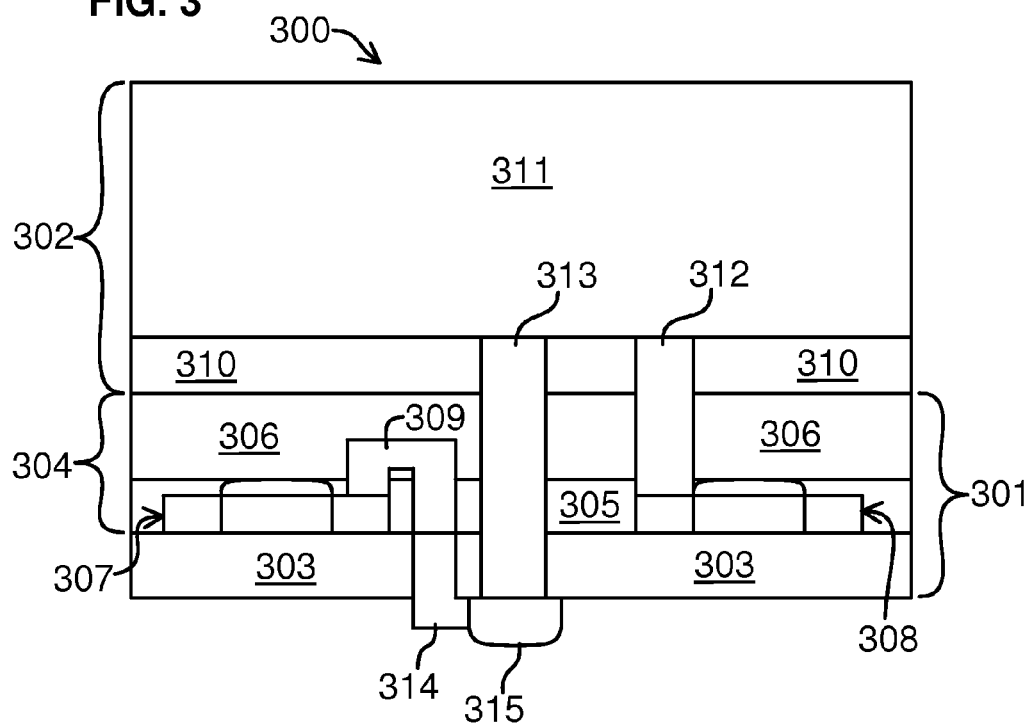
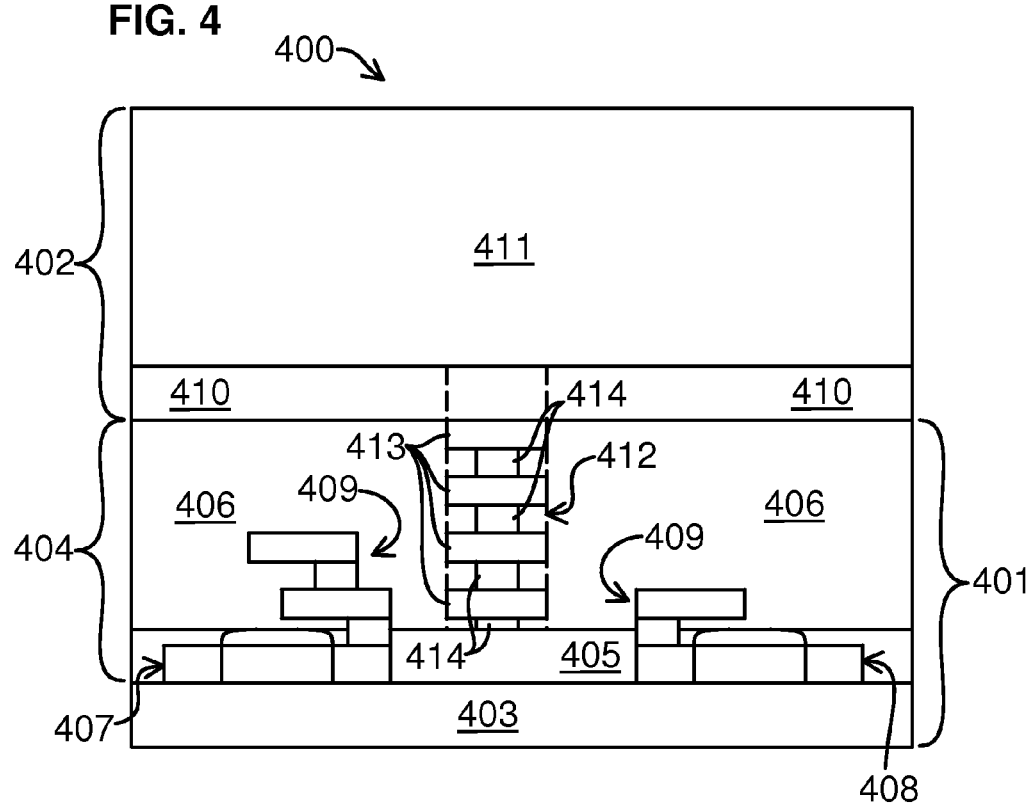

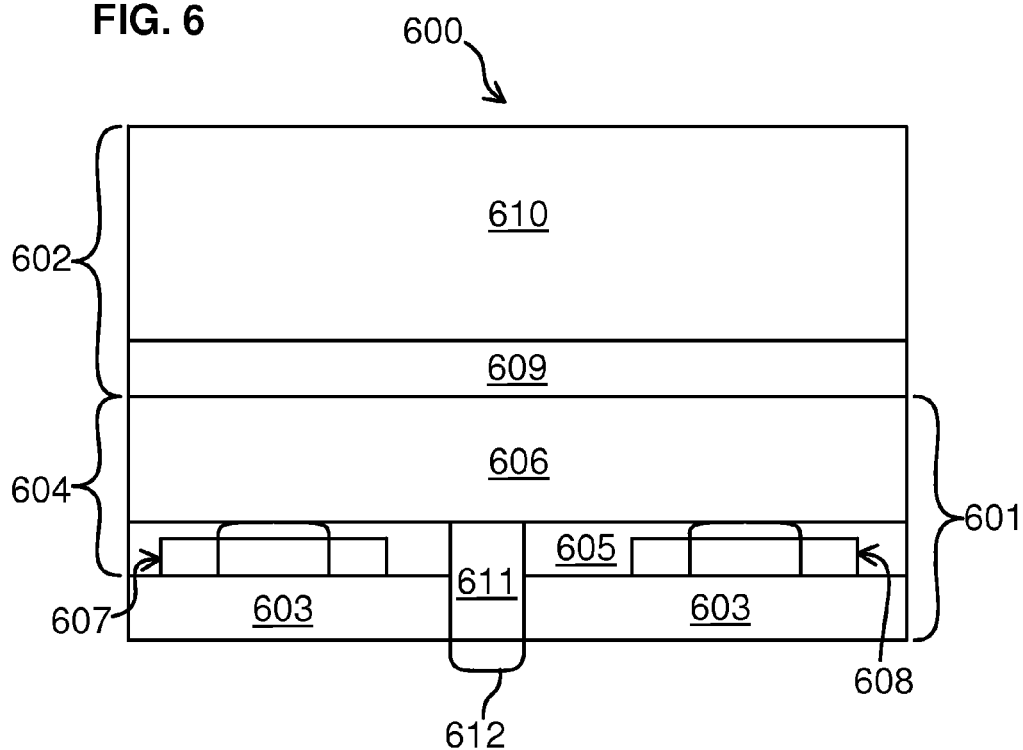
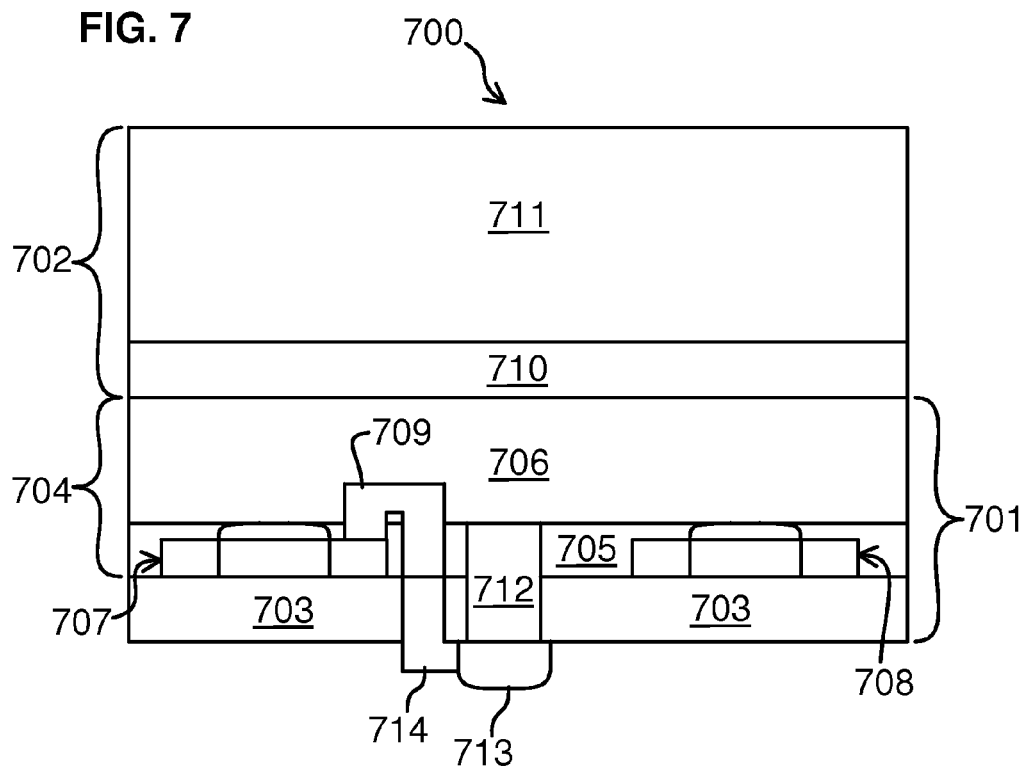

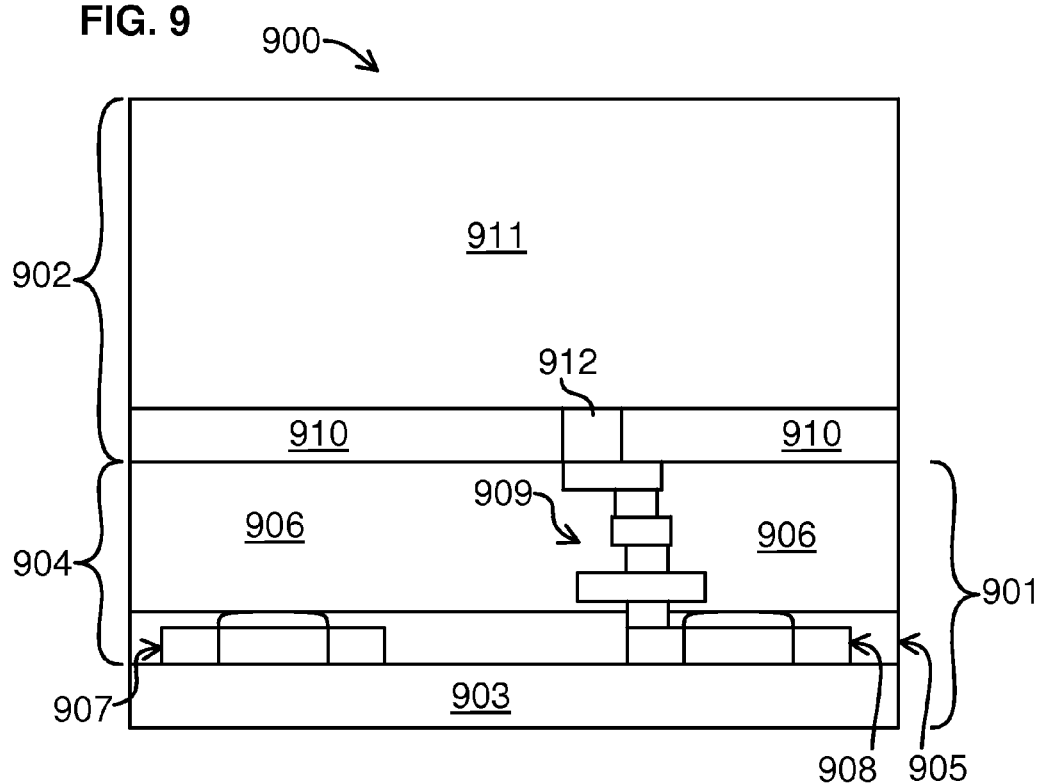
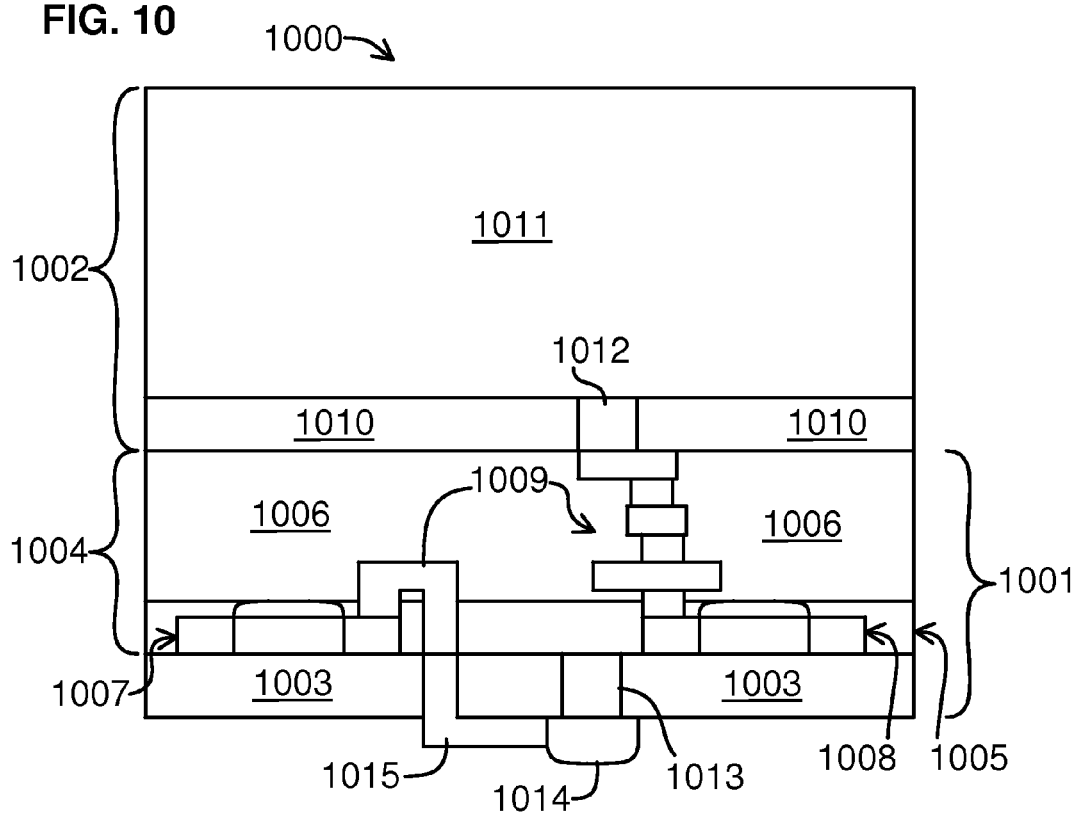

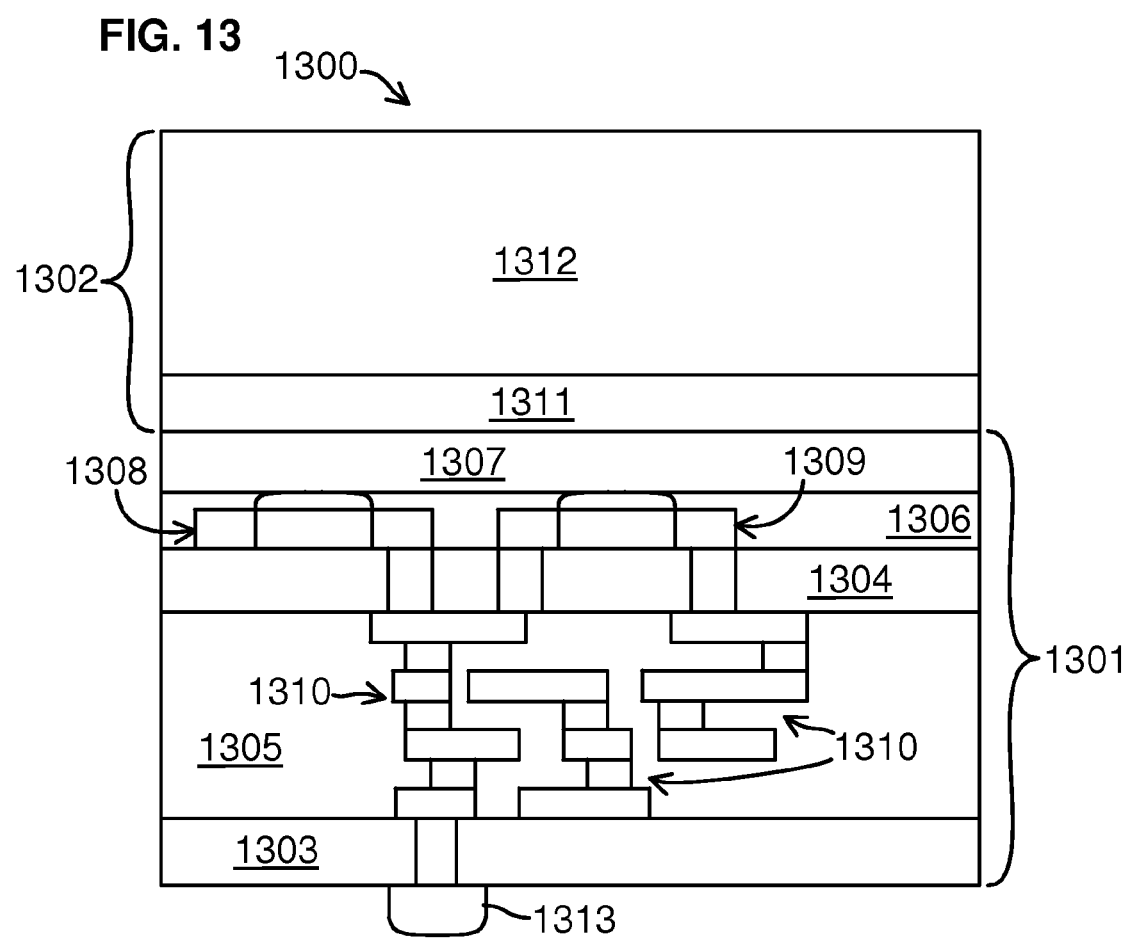

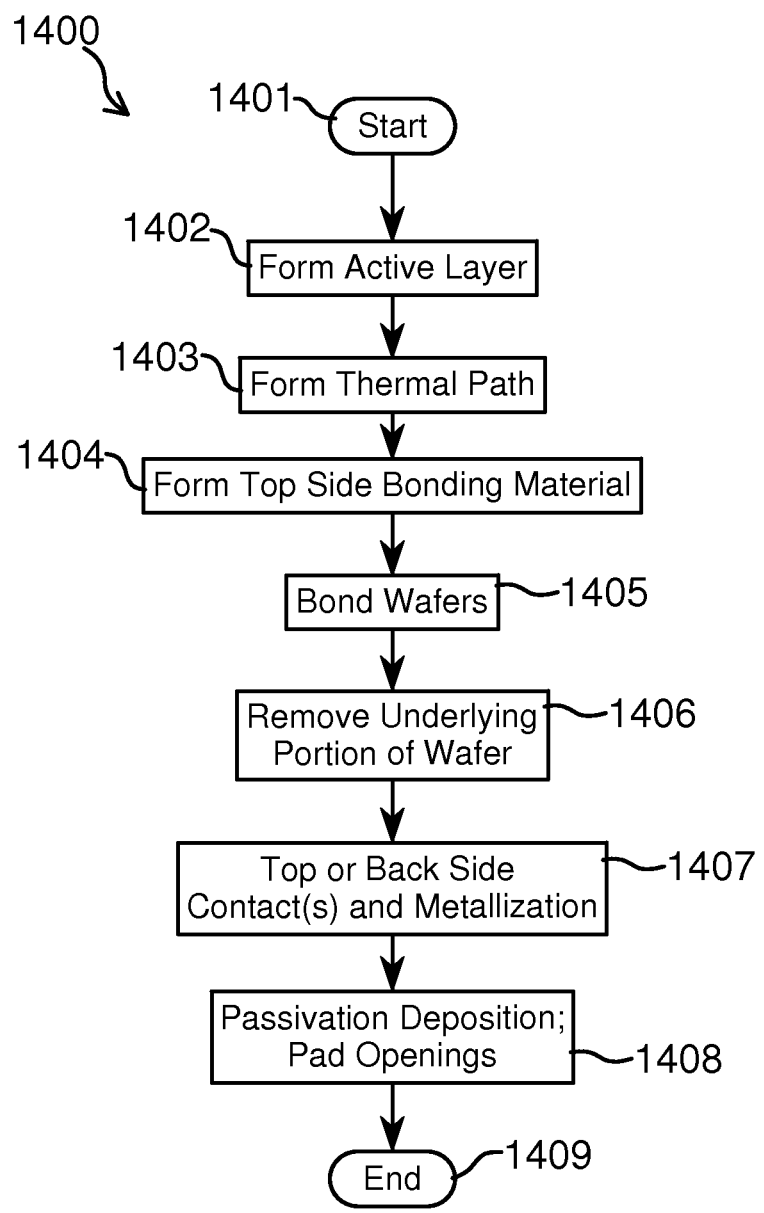

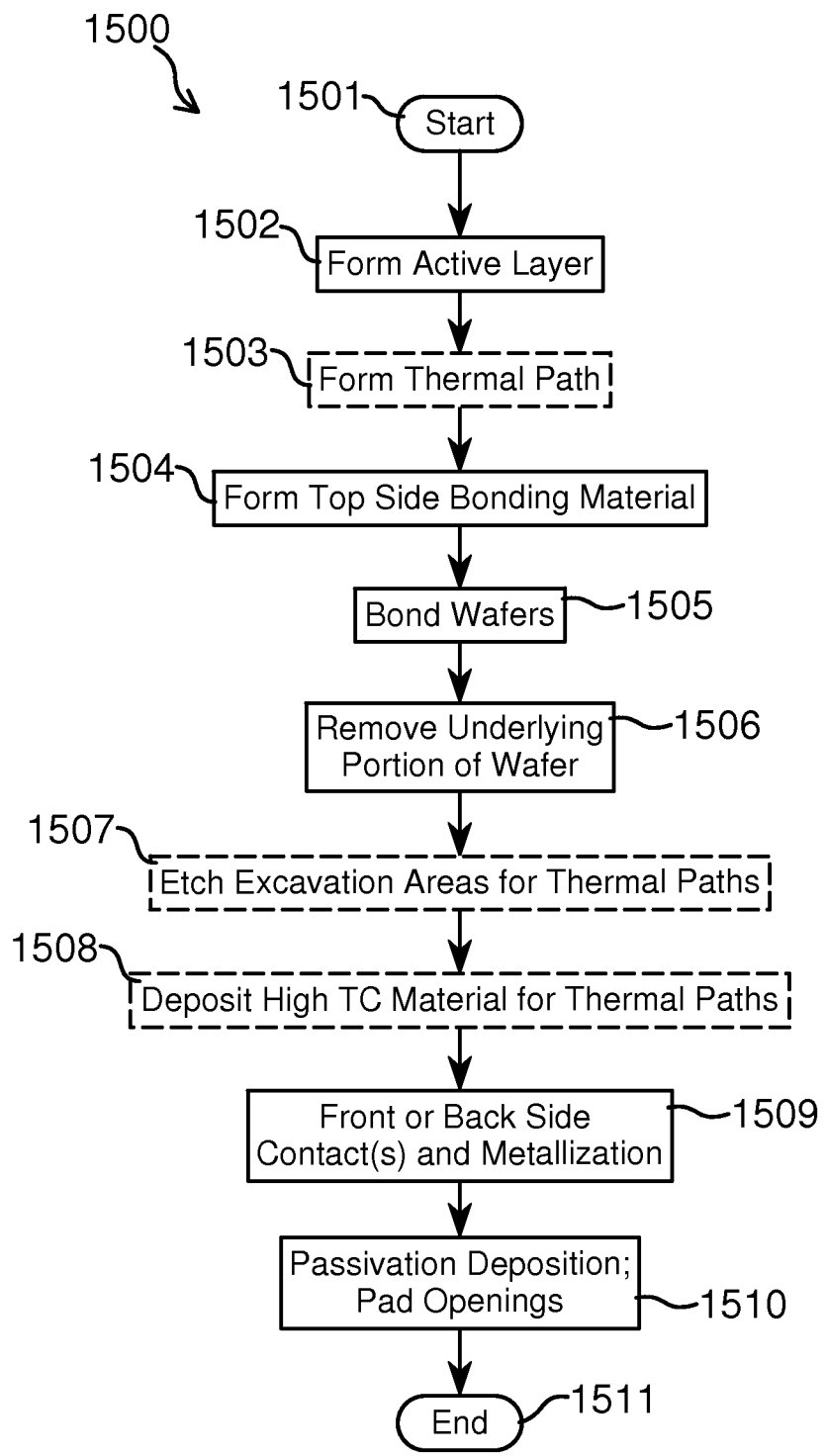

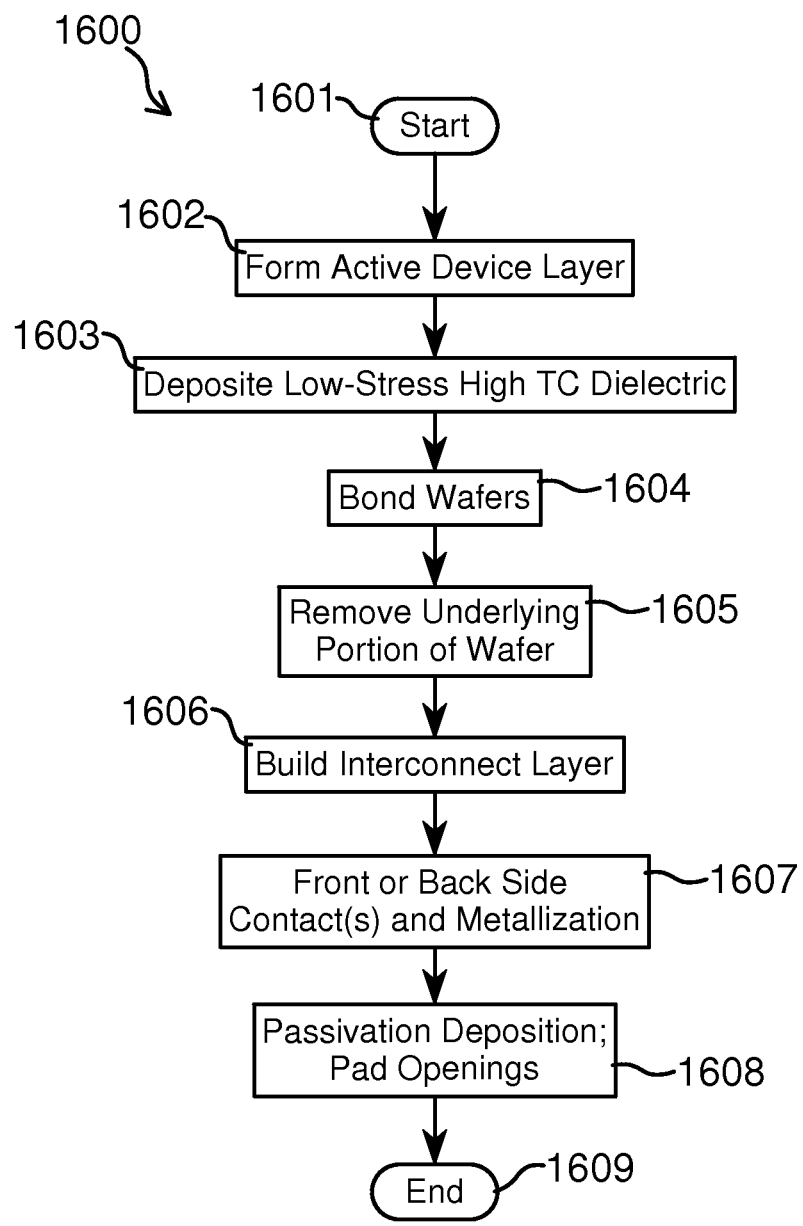

THERMAL CONDUCTION PATHS FOR SEMICONDUCTOR STRUCTURES

CROSS-REFERENCE TO RELATED APPLICATIONS

This patent document claims priority to Provisional Patent Application No. 61/422,650 filed Dec. 13, 2010, under 35 U.S.C. §119(e), which is incorporated herein by reference in its entirety.

BACKGROUND OF THE INVENTION

Semiconductor-on-insulator (SOI) technology, which represents an advance over traditional bulk semiconductor processes, was first commercialized in the late 1990s. The defining characteristic of SOI technology is that the semiconductor region in which circuitry is formed is isolated from bulk substrate by an electrically insulating layer.

As used herein and in the appended claims, the region in which signal-processing circuitry is formed on an SOI structure is referred to as the active layer of the SOI structure. When reference is made particularly to the layer of active semiconductor material that forms the active devices in an SOI structure the term active device layer is used instead.

The insulating layer of an SOI substrate is typically silicon-dioxide. The reason silicon-dioxide is chosen is that it can be formed on a wafer of silicon by oxidizing the wafer and is therefore amenable to efficient manufacturing. The advantageous aspects of SOI technology stem directly from the ability of the insulator layer to electronically isolate the active layer from bulk substrate. However, as described below the insulator layer that is the source of this advantageous aspect creates significant problems in terms of the thermal performance of SOI technology.

An example prior art SOI structure 100 is shown in FIG. 1. The structure 100 includes a substrate layer 101, an insulator layer 102 and an active layer 103. The substrate layer 101 is typically a semiconductor material such as silicon. The insulator layer 102 is a dielectric which is often silicon-dioxide formed through the oxidation of a portion of the substrate layer 101. The active layer 103 includes a combination of dopants, dielectrics, polysilicon, metal layers, passivation, and other layers that are present after circuitry has been formed therein. This circuitry may include metal wiring 104 (in a metal interconnect layer 105); passive devices such as resistors, capacitors, and inductors; and active devices such as a transistor 106 (in an active device layer 107.

As used herein and in the appended claims, the "top" or "front" of the structure 100 references a top surface 108 while the "bottom" or "back" of the structure 100 references a bottom surface 109. This orientation scheme persists regardless of the relative orientation of the structure 100 to other frames of reference, and the removal of layers from, or the addition of layers to the structure 100. Therefore, the active layer 103 is always "above" the insulator layer 102. In addition, a vector originating in the center of the active layer 103 and extending towards the bottom surface 109 will always point in the direction of the "back side" or "bottom" of the structure 100 regardless of the relative orientation of the structure 100 to other frames of references, and the removal of layers from, or the addition of layers to the structure 100.

SOI devices are imbued with the ability to enhance and preserve the electrical characteristics of their active devices as described above. However, the introduction of the insulator layer (e.g. 102) creates a significant problem in terms of the device's ability to dissipate heat. Due to the increasing miniaturization of the devices in integrated circuits, a greater number of heat generating devices must be pressed into a smaller and smaller area. In modern integrated circuits, the heat generation density of circuitry can be extreme. The introduction of the insulator layer 102 exacerbates this problem because the thermal conductivity of the insulator layer 102 is generally much lower than that of a standard bulk substrate.

As mentioned previously, silicon-dioxide is the ubiquitous insulator layer in modern SOI technology. At a temperature of 300 degrees Kelvin (K), silicon-dioxide has a thermal conductivity of roughly 1.4 Watts per meter per Kelvin (W/m/K). A bulk silicon substrate at the same temperature has a thermal conductivity of roughly 130 W/m/K. The nearly 100-fold reduction in heat dissipation performance exhibited by SOI technology is highly problematic. A high level of heat in an integrated circuit can shift the electrical characteristics of its devices outside an expected range causing critical design failures. Left unchecked, excess heat in a device can lead to permanent and critical failures in the form of warping or melting of materials in the device's circuitry.

Layer transfer devices can incorporate SOI technology. Layer transfer can be described with reference to a layer transfer structure 200 in FIG. 2. In an example layer transfer process for creating the structure 200, a handle wafer 201 is bonded to the top surface of an SOI wafer 202 (e.g. similar to SOI structure 100, FIG. 1). The SOI wafer 202, in this example, has a buried insulator layer 203 and an active layer 204 (with an active device layer 205 and a metal interconnect layer 206). The handle wafer 201 comprises a handle substrate layer 207 and a bonding material layer 208. After bonding, an underlying substrate layer (e.g. similar to 101) is commonly removed, such that the buried insulator layer 203 is exposed and forms a new back side surface 209 of the structure 200. Additional layers can be deposited on the back side surface 209 of the buried insulator layer 203 to form a barrier against contamination from the environment.

The dissipation of heat in layer transferred structures poses a significant problem. Although heat can be directed out of the system from the active layer through the buried insulator layer 203, there is a limit to how many contacts can be made through the buried insulator layer 203. Heat must therefore be conducted laterally through the structure 200 before it can reach a point where it can diffuse rapidly in a vertical direction out of the system. Lateral heat conduction is extremely difficult in SOI and layer transferred devices. The reason for this difficulty is that each layer is extremely thin and therefore has very high thermal resistivity in a lateral direction. A layer having a thickness of tens of micrometers (μm) would probably be sufficient to provide a highly thermally conductive lateral path through the layer capable of keeping peak temperatures in the active layer 204 below the temperature at which degradation mechanisms can become a reliability problem. However, most layers in a layer transfer device are less than 1 μm thick. Producing thicker layers is more costly in terms of the time it takes to deposit, grow or implant the layer. Since the production of semiconductor structures requires the use of extremely expensive capital equipment, procedures that take large amounts of time are prohibitively expensive. Thicker layers also introduce complexity into the process because planarization is more difficult with thicker layers.

BRIEF DESCRIPTION OF THE DRAWINGS

FIGS. 3-13 are simplified cross section diagrams of semiconductor structures incorporating embodiments of the present invention.

FIG. 14 is a flowchart of a simplified process for fabricating at least part of an integrated circuit chip having the semiconductor structure shown at least in FIG. 3, 4, 5, 9, 10 or 11, according to embodiments of the present invention.

FIG. 15 is a flowchart of a simplified process for fabricating at least part of an integrated circuit chip having the semiconductor structure shown at least in FIG. 6, 7, 8, 10, 11 or 12, according to embodiments of the present invention.

FIG. 16 is a flowchart of a simplified process for fabricating at least part of an integrated circuit chip having the semiconductor structure shown in FIG. 13, according to embodiments of the present invention.

DETAILED DESCRIPTION OF THE INVENTION

Figure 1:
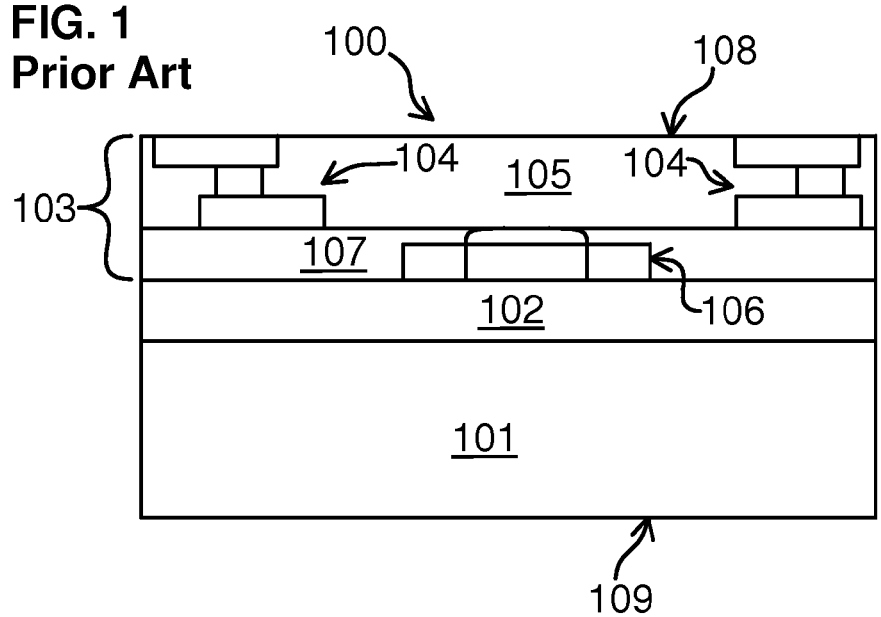
FIG. 1 is a simplified cross section diagram of a prior art SOI structure.
Figure 2:
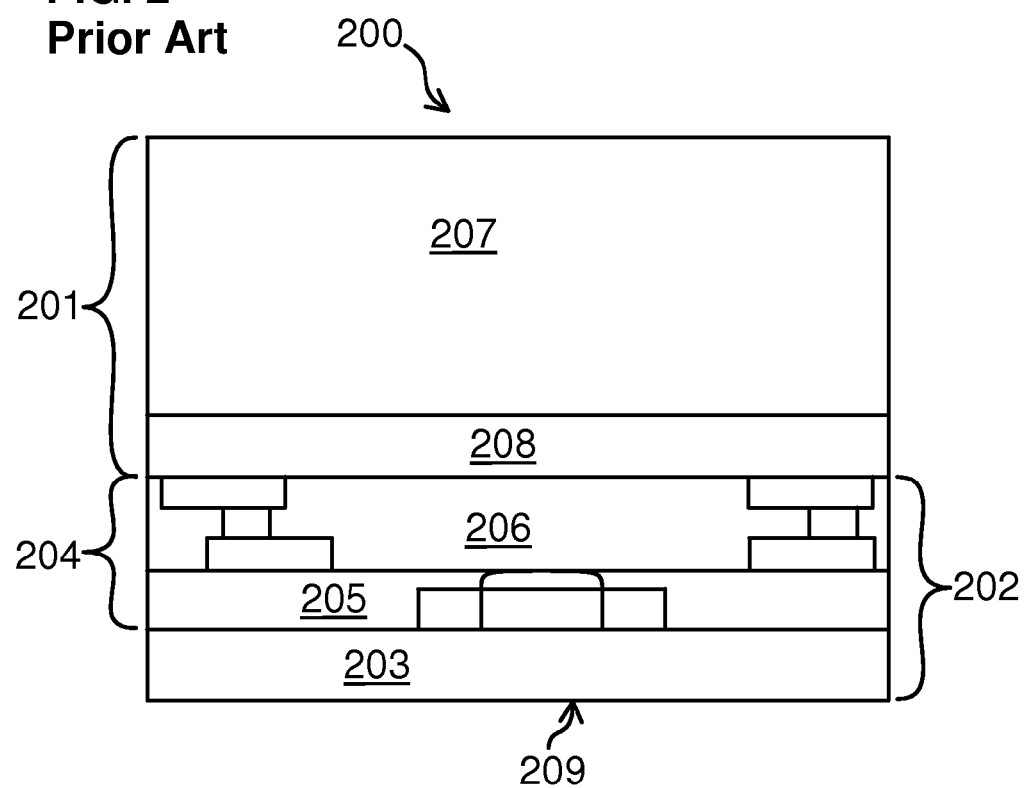
FIG. 2 is a simplified cross section diagram of a prior art layer transfer structure.

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used with another embodiment to yield a still further embodiment. Thus, it is intended that the present subject matter covers all such modifications and variations within the scope of the appended claims and their equivalents.

Embodiments of the present invention provide thermal paths that act as heat sinks for the active circuitry in semiconductor-on-insulator (SOI), bulk semiconductor and layer transferred semiconductor structures. In some embodiments of the invention, thermal paths are provided from circuitry in a active layer of the structure to a handle wafer substrate layer of the structure. In some embodiments of the invention, the handle wafer substrate layer can then serve as a heat sink to remove heat from the system. For example, in a wire-bond layer transferred device, heat can be removed from the top of the handle wafer through a package lead frame or a circuit board to which the device is attached. As another example, for a flip-chip layer transferred device, heat can leave the system through conduction through the plastic encapsulating package or through air convection from the handle wafer. In some embodiments of the invention, the handle wafer substrate layer can alternatively serve as a thermally conductive path with high lateral thermal conductivity. In some embodiments of the invention, heat that has been channeled laterally through the handle wafer substrate layer can be channeled down and out of the structure through another thermal path which provides a heat sink from the handle wafer substrate layer to thermal contacts on the back side of the structure. As an example, in a flip-chip layer transferred device, heat can go through the flip-chip contacts to the traces on a printed circuit board or low temperature co-fired ceramic (LTCC) substrate to which a die for the device is attached.

As used in this specification and in the appended claims, the term "thermal path" refers to a contiguous region of one or more materials that have higher thermal conductivity than silicon dioxide and that are capable of serving as an efficient heat sink from one region to another. As used in this specification and in the appended claims, the term "high thermally conductive (TC) dielectric material" refers to materials having high thermal conductivity and low electrical conductivity so that they can provide an efficient thermal path while not producing any changes in the electrical behavior of surrounding circuitry. Examples of materials that may be used as high TC dielectric materials include AlN, SiC, Si3N4, diamond, diamond-like carbon, graphene, carbon nanotubes, un-doped poly-silicon, and other materials having similar characteristics.

Some embodiments of the present invention can be described with reference to FIG. 3. FIG. 3 illustrates a layer transferred structure 300 generally comprising a semiconductor wafer 301 and a handle wafer 302 bonded together.

The semiconductor wafer 301 may be a conventional semiconductor-on-insulator (SOI) wafer or a conventional bulk semiconductor wafer. Additionally, although the semiconductor material of the semiconductor wafer 301 in many embodiments may be silicon, it is understood that the present invention is not necessarily so limited, but that other semiconductor materials (e.g. GaAs, SiC, GaN, InGaAs, InP, etc.) are generally within the scope of the present invention.

The semiconductor wafer 301 generally has an insulator layer 303 and an active layer 304. The active layer 304 generally includes an active device layer 305 and an interconnect layer 306. The active device layer 305 generally includes active semiconductor devices, such as transistors 307 and 308. The interconnect layer 306 generally includes electrically conductive traces (e.g. metal wires and/or other types of electrical conductors) separated by dielectric materials. An example conductive trace 309 is shown disposed within portions of the interconnect layer 306 and the active device layer 305, but may actually represent various different layers of any appropriate type(s) of electrically conductive materials. (Other layers or materials containing dielectrics, oxides, passivation layers, etc. may also be part of the semiconductor wafer 301, but are not shown for simplicity.)

The handle wafer 302 generally has a bonding layer 310 and a substrate layer 311. The bonding layer 310 may be an oxide, adhesive or other appropriate material deposited, epitaxially grown or implanted in or on the handle wafer 302 for bonding the handle wafer 302 to the semiconductor wafer 301. The substrate layer 311 may be any appropriate semiconductor material, such as silicon, GaAs, SiC, GaN, InGaAs, InP, etc.

The layer transferred structure 300 also generally has two thermal paths 312 and 313, redistribution conductor 314 and a back side external contact 315. The external contact 315 may be a bump or contact pad or other material and structure for electrically connecting to an external electrical lead for the structure 300. The redistribution conductor 314 may be various electrically conductive materials and layers surrounded by dielectric materials. Each thermal path 312 or 313 may be one or more highly thermally conductive materials and layers.

The redistribution conductor 314 electrically connects the external contact 315 to circuitry (e.g. the conductive trace 309 and the transistor 307) within the active layer 304. This connection is an electrical conductivity path to such circuitry. However, this path is also an example of a readily available thermal dissipation path (e.g. for heat generated by circuitry, such as the transistor 307), since 1) the materials for the external contact 315, the redistribution conductor 314 and the conductive trace 309 are generally highly thermally conductive as well as electrically conductive and 2) the path leads to the outside of the structure 300 at the external contact 315, where the heat can be dissipated to a surrounding environment.

By contrast, the second transistor 308 illustrates an example situation in which there is no readily available thermal dissipation path to dissipate heat generated by such circuitry. The first thermal path 312 and the second thermal path 313 are, therefore, configured to act in combination with the handle substrate layer 311 to form a heat sink, or highly thermally conductive path, from the circuitry area (e.g. the transistor 308) near the first thermal path 312 to the external contact 315.

The first thermal path 312, for example, generally extends through at least part of the active layer 304 (both the active device layer 305 and the interconnect layer 306) of the semiconductor wafer 301 and the bonding layer 310 of the handle wafer 302. The bottom of the first thermal path 312 generally contacts (or is close to) any appropriate part of the active device layer 305, and the top of the first thermal path 312 generally contacts (or is close to) any appropriate part of the handle substrate layer 311. The first thermal path 312 is thus generally configured to act as a heat sink branch to thermally connect an area of circuitry (e.g. the transistor 308) in the active device layer 305 to the handle substrate layer 311.

The second thermal path 313 generally extends through the insulator layer 303, the active layer 304 and the bonding layer 310. The bottom of the second thermal path 313 generally contacts (or is close to) any appropriate part of the external contact 315, and the top of the second thermal path 313 generally contacts (or is close to) any appropriate part of the handle substrate layer 311. The second thermal path 313 is thus generally configured to act as a heat sink branch to thermally connect the handle substrate layer 311 to the external contact 315.

FIG. 3 is not drawn to scale in that the handle substrate layer 311 is much thicker than any other layer in the structure 300. Due to the fact that lateral heat conduction is so difficult through thin layers, in some embodiments of the invention heat will flow more easily through the combination of the thermal paths 312, 313, and the handle substrate layer 311 than it will through the active layer 304. Some of the heat generated by the transistor 308, for example, will probably flow towards other adjacent devices or components in the active layer 304. However, a portion of the heat generated by the transistor 308 (and by other nearby heat-generating components or devices), instead of adversely affecting other devices or components in the active layer 304, can flow through the first thermal path 312, the handle substrate layer 311 and the second thermal path 313 to the external contact 315, where the heat can be dissipated to a surrounding environment.

A combination of thermal paths, such as 312 and 313, may thus be strategically distributed throughout the structure 300 to provide a significant improvement in the heat dissipation of the structure 300 as compared to structures for heat dissipation known in the prior art. Additionally, any of these thermal paths may benefit from the addition of a heat spreading layer at either end of each path. In this manner, heat-related problems of devices within the structure 300 are mitigated by embodiments of the present invention.

The thermal paths 312 and 313 may be fabricated with any appropriate highly thermally conductive material or a combination of different types of highly thermally conductive materials, including as described for other thermal paths herein. For example, the material may be a high TC (thermal conductivity) dielectric material (such as un-doped poly-silicon or AlN), plates of dummy metal or plates connected vertically with arrays of densely-packed vias or large-opening vias. If the material (or a portion thereof) is also electrically conductive (e.g. metal or various types of semiconductors), then the thermal paths 312 and 313 may be electrically isolated from surrounding circuitry. For example, a relatively thin layer of electrically insulating (but thermally conductive) material may surround a core of highly thermally conductive metal. Additionally, the thermal paths 312 and 313 may be fabricated as stacks of material added at each step in an overall fabrication process for the surrounding circuitry or fabricated as a single core of material (after forming the surrounding circuitry) using through semiconductor via (TSV) processes.

Some embodiments of the present invention can be described with reference to FIG. 4. FIG. 4 illustrates a layer transferred structure 400 generally comprising a semiconductor wafer 401 and a handle wafer 402 bonded together.

The semiconductor wafer 401 may be a conventional semiconductor-on-insulator (SOI) wafer or a conventional bulk semiconductor wafer. Additionally, although the semiconductor material of the semiconductor wafer 401 in many embodiments may be silicon, it is understood that the present invention is not necessarily so limited, but that other semiconductor materials (e.g. GaAs, SiC, GaN, InGaAs, InP, etc.) are generally within the scope of the present invention.

The semiconductor wafer 401 generally has an insulator layer 403 and an active layer 404. The active layer 404 generally includes an active device layer 405 and an interconnect layer 406. The active device layer 405 generally includes active semiconductor devices, such as transistors 407 and 408. The interconnect layer 406 generally includes electrically conductive traces 409 (e.g. metal wires and/or other types of electrical conductors) separated by dielectric materials. The conductive traces 409 may represent various different layers of any appropriate type(s) of electrically conductive materials. (Other layers or materials containing dielectrics, oxides, passivation layers, etc. may also be part of the semiconductor wafer 401, but are not shown for simplicity.)

The handle wafer 402 generally has a bonding layer 410 and a substrate layer 411. The bonding layer 410 may be an oxide, adhesive or other appropriate material deposited, epitaxially grown or implanted in or on the handle wafer 402 for bonding the handle wafer 402 to the semiconductor wafer 401. The substrate layer 411 may be any appropriate semiconductor material, such as silicon, GaAs, SiC, GaN, InGaAs, InP, etc.

The layer transferred structure 400 also generally has a thermal path 412 that generally extends through the interconnect layer 406 and the bonding layer 410. The thermal path 412 thus generally extends from about a top surface of the active device layer 405 to about a bottom surface of the handle substrate layer 411.

In some embodiments of the invention, heat generally transfers from the active device layer 405 to the handle substrate layer 411 through the thermal path 412. If the structure 400 is in a bond-wire configuration heat will generally dissipate from the handle wafer 402 to a package lead frame or a circuit board (not shown) to which the structure 400 is attached. If the structure 400 is configured in a flip chip configuration heat will generally dissipate by conduction through a plastic encapsulating package (not shown) or through air convection from the handle wafer 402 if the structure 400 is not encapsulated. In addition, heat can dissipate laterally through the handle substrate layer 411 for further dissipation through other thermal paths.

In some embodiments of the invention, the thermal path 412 can have variant structures. For example, the thermal path 412 may extend into the active layer 404 (as shown) or may only be disposed on a top surface of the active layer 404.

Alternatively, the thermal path 412 may be disposed on the top surface of the active device layer 405 (as shown) or may extend into the active device layer 405. Similarly, the thermal path 412 may extend into or terminate at the bonding layer 410. The thermal path 412 may also extend into the handle substrate layer 411 or may terminate on the bottom surface of the handle substrate layer 411.

In addition, the material that comprises the thermal path 412 may be jagged or may exhibit a non-uniform surface such that the surface area of the junction between the thermal path 412 and any surface it comes into contact with is increased. In some embodiments of the invention, the thermal path 412 extends into the handle substrate layer 411 and has a jagged top surface such that the surface area of the end of the thermal path 412 is increased.

In some embodiments, the thermal path 412 may have any appropriate material and/or structure described above for the thermal paths 312 and 313. In some embodiments of the invention, a portion of the thermal path 412 that extends through the interconnect layer 406 can have variant compositions. For example, the thermal path 412 may be formed of a homogenous high TC dielectric material such as un-doped poly-silicon or AlN. As illustrated in FIG. 4, the thermal path 412 may also be comprised of plates 413 of dummy metal or plates 413 connected vertically with arrays of densely-packed vias or large-opening vias 414. The isolation material in a stack of metal lines generally has a much lower thermal conductivity as compared to the metal and vias themselves. Dummy metal thus allows a designer to form a mesh of solid metal 413 and vias 414 that maximize the vertical thermal conductivity of the thermal path 412 as compared to a thermal path formed of standard signal metal lines that may consist of more isolation material than metal.

Additionally, the thermal path 412 may be comprised of signal metal lines that are both operating to route signals through the active layer 404 and are serving a secondary function as thermal conductors. The thermal path 412 can also be a combination of a high TC dielectric laid out to go between metallization features so that the signal routing area is not overly diminished.

In some embodiments of the invention, the thermal path 412 can be a combination of any of the embodiments mentioned above. For example, the thermal path 412 can be a combination of a high TC dielectric material laid down to a certain level of metallization and a stack of either dummy or signal metal lines from that level of metallization down to the active device layer 405. In some embodiments of the invention, the thermal path 412 can be a combination of any high TC material laid down to a certain level of metallization and used with a stack of dummy metal lines, since it is not always as imperative for dummy metal lines to be kept electrically isolated.

In some embodiments of the invention, a portion of the thermal path 412 that extends through the bonding layer 410 can have variant compositions. For example, the thermal path 412 may be comprised of a dielectric material that may serve a dual purpose as a material in the bonding layer 410 and as a portion of the thermal path 412 with high thermal conductivity. In some embodiments of the invention, the bonding layer 410 may be part of the semiconductor wafer 401 and the material comprising the thermal path 412 may cover the entire top surface of the semiconductor wafer 401 as at least part of the bonding layer 410. For example, the top surface of the semiconductor wafer 401 may be comprised entirely of un-doped poly-silicon. (An additional benefit of this particular embodiment would be that the Si—Si direct bond between the semiconductor wafer 401 and the handle wafer substrate 411 will form a trap-rich layer on the surface of the handle wafer 402. This trap rich layer will improve isolation and linearity of circuits such as RF switches that are in the active layer 404.)

As another example, the top surface of the semiconductor wafer 401 may be comprised entirely of AlN which may serve as a portion of the thermal path 412 and may also serve as an ionic contamination barrier passivation layer for the semiconductor wafer 401. In some embodiments of the invention, the material comprising the thermal path 412 may be even or flush with the top surface of the semiconductor wafer 401 and may be in direct contact with the bonding layer 410 after layer transfer. In some embodiments of the invention, the bonding layer 410 may be a part of the thermal path 412.

In some embodiments of the invention, the thermal path 412 can be laid out in variant patterns relative to the circuitry in the active layer 404. In some embodiments of the invention, the thermal path 412 may comprise a trench that extends down to the active device layer 405 in a pattern over source and drain fingers of switches, power amplifiers, or other heat-producing circuitry in the active device layer 405. In some embodiments of the invention, the thermal path 412 may extend down to the active device layer 405 in a pattern over the source, drain, or gate areas of transistors in the active device layer 405. Additionally, in some embodiments of the invention, the aforementioned pattern may extend down only over the active areas of the devices (e.g. the transistors 407 and 408) in the active device layer 405.

Figure 5:
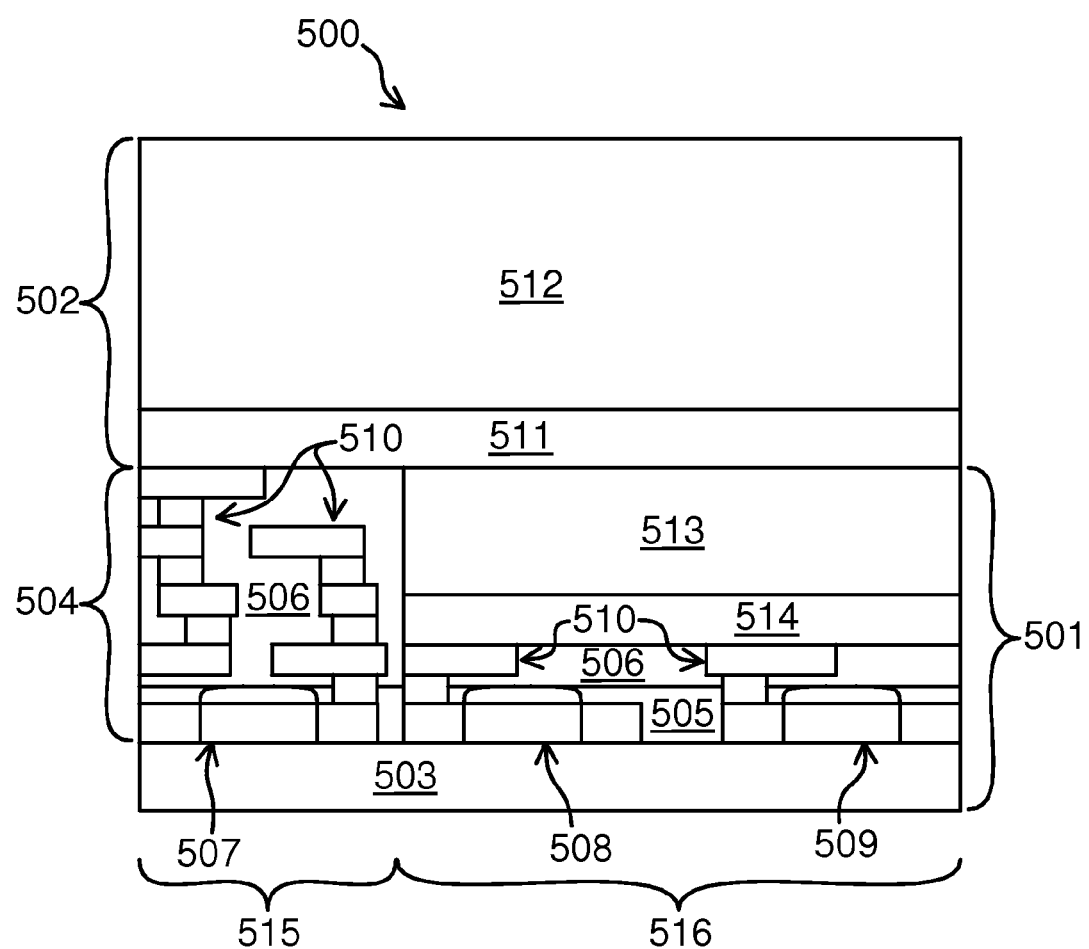

Some embodiments of the present invention can be described with reference to FIG. 5. FIG. 5 illustrates a layer transferred structure 500 generally comprising a semiconductor wafer 501 and a handle wafer 502 bonded together.

The semiconductor wafer 501 may be a conventional semiconductor-on-insulator (SOI) wafer or a conventional bulk semiconductor wafer. Additionally, although the semiconductor material of the semiconductor wafer 501 in many embodiments may be silicon, it is understood that the present invention is not necessarily so limited, but that other semiconductor materials (e.g. GaAs, SiC, GaN, InGaAs, InP, etc.) are generally within the scope of the present invention.

The semiconductor wafer 501 generally has an insulator layer 503 and an active layer 504. The active layer 504 generally includes an active device layer 505 and an interconnect layer 506. The active device layer 505 generally includes active semiconductor devices, such as transistors 507, 508 and 509. The interconnect layer 506 generally includes electrically conductive traces 510 (e.g. metal wires and/or other types of electrical conductors) separated by dielectric materials. The conductive traces 510 may represent various different layers of any appropriate type(s) of electrically conductive materials. (Other layers or materials containing dielectrics, oxides, passivation layers, etc. may also be part of the semiconductor wafer 501, but are not shown for simplicity.)

The handle wafer 502 generally has a bonding layer 511 and a substrate layer 512. The bonding layer 511 may be an oxide, adhesive or other appropriate material deposited, epitaxially grown or implanted in or on the handle wafer 502 for bonding the handle wafer 502 to the semiconductor wafer 501. The substrate layer 512 may be any appropriate semiconductor material, such as silicon, GaAs, SiC, GaN, InGaAs, InP, etc.

The layer transferred structure 500 also generally has a thermal path 513 and an etch stop layer 514. The thermal path 513 generally extends from the etch stop layer 514 to the handle wafer 502. The etch stop layer 514 is generally disposed above and adjacent to a layer of conductors in the interconnect layer 506.

In some embodiments of the invention, variant compositions and patterns for the thermal path 513 can be combined to produce embodiments with beneficial characteristics. For example, a first circuit region 515 may contain high density digital logic requiring many levels or layers of metallization or the conductive traces 510 in the interconnect layer 506, while a second circuit region 516 may contain simpler analog circuitry that does not require as many layers of the conductive traces 510 in the interconnect layer 506. In such cases, the etch stop layer 514 may separate the layers of the conductive traces 510 that are used only in the first circuit region 515 from those layers of the conductive traces 510 that are used in the second circuit region 516.

The thermal path 513 may comprise a relatively large region of high TC material located above the etch stop layer 514. In some embodiments of the invention, the conductive traces 510 in the first circuit region 515 and the conductive traces 510 and the high TC material of the thermal path 513 in the second circuit region 516 may both serve as thermal paths from the active device layer 505 to the handle wafer 501.

Additionally, in some embodiments of the invention, the etch stop layer 514 may be comprised of high thermal conductivity material to aid the removal of heat from the active device layer 505. In some embodiments of the invention, the material of the etch stop layer 514 may be the same high TC material as is in the thermal path 513. In some embodiments of the invention, the material of the etch stop layer 514 may be a different high TC material from that of the thermal path 513. In each of the cases, the etch stop layer 514 and the thermal path 513 (and optionally the bonding layer 511) together generally form an overall larger thermal path from the conductive traces 510 in an intermediate level of the interconnect layer 506 to the handle wafer 502.

Some embodiments of the present invention can be described with reference to FIG. 6. FIG. 6 illustrates a layer transferred structure 600 generally comprising a semiconductor wafer 601 and a handle wafer 602 bonded together.

The semiconductor wafer 601 may be a conventional semiconductor-on-insulator (SOI) wafer or a conventional bulk semiconductor wafer. Additionally, although the semiconductor material of the semiconductor wafer 601 in many embodiments may be silicon, it is understood that the present invention is not necessarily so limited, but that other semiconductor materials (e.g. GaAs, SiC, GaN, InGaAs, InP, etc.) are generally within the scope of the present invention.

The semiconductor wafer 601 generally has an insulator layer 603 and an active layer 604. The active layer 604 is above the insulator layer 603. The active layer 604 generally includes an active device layer 605 and an interconnect layer 606. The active device layer 605 generally includes active semiconductor devices, such as transistors 607 and 608. The interconnect layer 606 generally includes electrically conductive traces (e.g. metal wires and/or other types of electrical conductors, not shown) separated by dielectric materials. The conductive traces may represent various different layers of any appropriate type(s) of electrically conductive materials. (Other layers or materials containing dielectrics, oxides, passivation layers, etc. may also be part of the semiconductor wafer 601, but are not shown for simplicity.)

The handle wafer 602 is located above the active layer 604. The handle wafer 602 generally has a bonding layer 609 and a substrate layer 610. The bonding layer 609 may be an oxide, adhesive or other appropriate material deposited, epitaxially grown or implanted in or on the handle wafer 602 for bonding the handle wafer 602 to the semiconductor wafer 601. The substrate layer 610 may be any appropriate semiconductor material, such as silicon, GaAs, SiC, GaN, InGaAs, InP, etc.

The layer transferred structure 600 also generally has a thermal path 611 and a back side external thermal contact 612. The thermal path 611 generally extends through the active device layer 605 and the insulator layer 603 from about the interconnect layer 606 to the thermal contact 612. (The thermal path 611 is shown extending through the active device layer 605 to the thermal contact 612, but in some embodiments, the thermal path 611 may terminate on a bottom surface of the active device layer 605.) In general, the thermal path 611 provides an exit for heat generated in the active layer 604 to move through the exposed insulator layer 603. Additionally, the thermal path 611 and the thermal contact 612 may be combined with any of the thermal paths 312, 313, 412 and 513.

The thermal contact 612 may be one contact in a set of contacts. Although there is a limit to how many thermal contacts can be formed and lateral heat conduction is relatively small, the adjacent circuitry (e.g. the transistors 607 and 608) may be cooled to a significant degree by the thermal path 611 and the thermal contact 612.

The thermal contact 612 may be either electrically insulating or conducting. As a conductor, the thermal contact 612 may also be used to provide an electrical contact for an electrical signal that is external to the structure 600.

In some embodiments of the invention, the layer transferred structure 600 may be used in a flip-chip configuration. In this case, heat is transferred through thermal contacts (such as the thermal contact 612) from the structure 600 to traces on a printed circuit board or a low temperature co-fired ceramic (LTCC) substrate to which a die containing the structure 600 is attached.

In some embodiments of the invention, the thermal path 611 may have variant compositions and patterns. Additionally, the thermal conduction path 611 may be any type of high TC dielectric, so it generally achieves the beneficial thermally conductive results discussed previously while maintaining the electrical performance of the overall circuit (e.g. including the transistors 607 and 608). As such, a plurality of the thermal path 611 may be laid out in patterns to optimize their efficacy. For example, the thermal paths 611 may be placed either around the border of source and drain regions of active devices (e.g. the transistors 607 and 608) or in any other pattern relative to the devices in the active device layer 605.

Some embodiments of the invention can be described with reference to FIG. 7. FIG. 7 illustrates layer transferred structure 700 generally comprising a semiconductor wafer 701 and a handle wafer 702 bonded together.

The semiconductor wafer 701 may be a conventional semiconductor-on-insulator (SOI) wafer or a conventional bulk semiconductor wafer. Additionally, although the semiconductor material of the semiconductor wafer 701 in many embodiments may be silicon, it is understood that the present invention is not necessarily so limited, but that other semiconductor materials (e.g. GaAs, SiC, GaN, InGaAs, InP, etc.) are generally within the scope of the present invention.

The semiconductor wafer 701 generally has an insulator layer 703 and an active layer 704. The active layer 704 is above the insulator layer 703. The active layer 704 generally includes an active device layer 705 and an interconnect layer 706. The active device layer 705 generally includes active semiconductor devices, such as transistors 707 and 708. The interconnect layer 706 generally includes electrically conductive traces (e.g. metal wires and/or other types of electrical conductors) separated by dielectric materials. An example conductive trace 709 is shown disposed within portions of the interconnect layer 706 and the active device layer 705, but may actually represent various different layers of any appropriate type(s) of electrically conductive materials. (Other layers or materials containing dielectrics, oxides, passivation layers, etc. may also be part of the semiconductor wafer 701, but are not shown for simplicity.)

The handle wafer 702 is located above the active layer 704. The handle wafer 702 generally has a bonding layer 710 and a substrate layer 711. The bonding layer 710 may be an oxide, adhesive or other appropriate material deposited, epitaxially grown or implanted in or on the handle wafer 702 for bonding the handle wafer 702 to the semiconductor wafer 701. The substrate layer 711 may be any appropriate semiconductor material, such as silicon, GaAs, SiC, GaN, InGaAs, InP, etc.

The layer transferred structure 700 also generally includes a thermal path 712, a back side external electrical contact 713 and a redistribution conductor 714. The thermal path 712 generally extends through the insulator layer 703 and at least part of the active device layer 705 between the interconnect layer 706 and the electrical contact 713. (The thermal path 712 is shown extending through the active device layer 705 to the electrical contact 713, but in some embodiments, the thermal path 712 may terminate on a bottom surface of the active device layer 705.) In general, the thermal path 712 provides an exit for heat generated in the active layer 704 to move through the exposed insulator layer 703. Additionally, the thermal path 712 and the electrical contact 713 may be combined with any of the thermal paths 312, 313, 412 and 513.

The electrical contact 713 may be any form of electrical contact. In some embodiments of the invention, the electrical contact 713 is a copper pillar or a solder bump for flip-chip contacting of the structure 700. In some embodiments of the invention, the thermal path 712 is electrically insulating and is in contact with the redistribution conductor 714, which may be similar in composition, structure and function as the redistribution conductor 314 of FIG. 3.

Embodiments of the invention that are in accordance with the structure 700 generally exhibit advantageous characteristics in that the location of thermal contacts and electrical contacts can be decoupled. This advantage is relatively significant given the effect that the relative lateral location of thermal contacts have on the thermal dissipation performance of the system. Some embodiments of the invention may have a plurality of the electrical contact 713, wherein some of the contacts 713 may be thermal contacts (e.g. the thermal contact 612, FIG. 6) while other contacts 713 may be designed to have solely electrical or both electrical and thermal functions.

Figure 8:
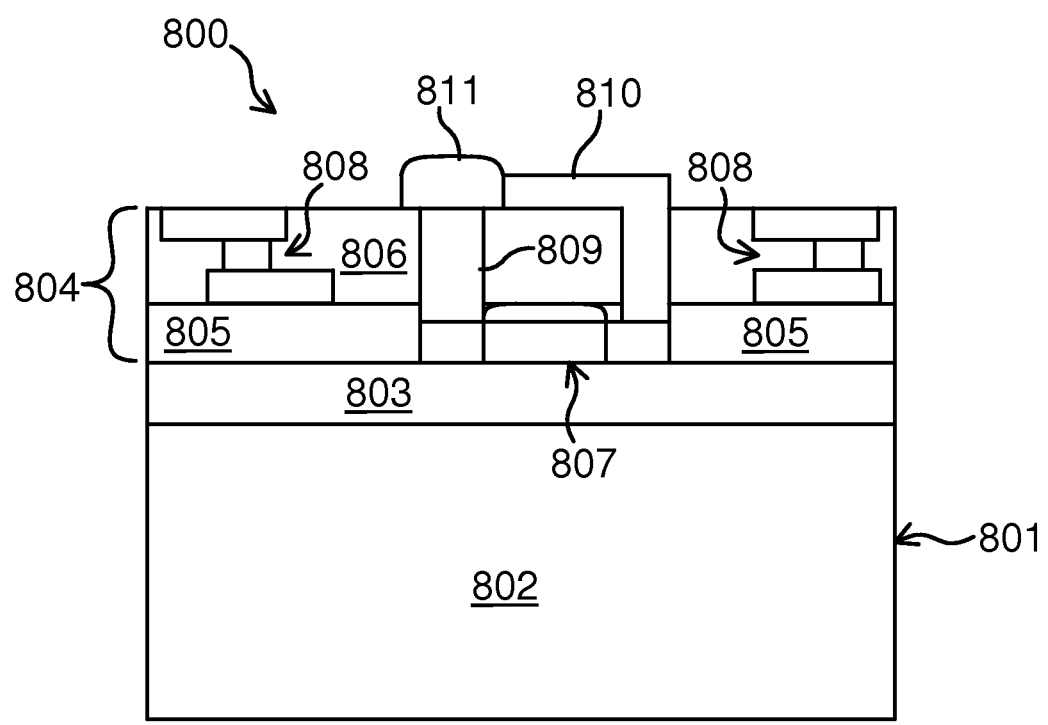

Some embodiments of the invention can be described with reference to FIG. 8. FIG. 8 illustrates a structure 800 generally comprising a semiconductor wafer 801 without a handle wafer.

The semiconductor wafer 801 may be a conventional semiconductor-on-insulator (SOI) wafer or a conventional bulk semiconductor wafer. Additionally, although the semiconductor material of the semiconductor wafer 801 in many embodiments may be silicon, it is understood that the present invention is not necessarily so limited, but that other semiconductor materials (e.g. GaAs, SiC, GaN, InGaAs, InP, etc.) are generally within the scope of the present invention.

The semiconductor wafer 801 generally has a semiconductor substrate 802, an insulator layer 803 and an active layer 804. The active layer 804 is above the insulator layer 803. The active layer 804 generally includes an active device layer 805 and an interconnect layer 806. The active device layer 805 generally includes active semiconductor devices, such as a transistor 807. The interconnect layer 806 generally includes electrically conductive traces 808 (e.g. metal wires and/or other types of electrical conductors) separated by dielectric materials. The conductive traces 808 may represent various different layers of any appropriate type(s) of electrically conductive materials. (Other layers or materials containing dielectrics, oxides, passivation layers, etc. may also be part of the semiconductor wafer 801, but are not shown for simplicity.)

The structure 800 also generally comprises a thermal path 809, redistribution conductor 810, and an external electrical contact 811. The thermal path 809 may include any of the composition or structure, and may be formed in any manner, described for the thermal paths 312, 313, 412, 513, 611 and 712, as appropriate. Additionally, the redistribution conductor 810, which may be similar in composition, structure and function as the redistribution conductor 314 or 714 of FIG. 3 or 7.

The redistribution conductor 810 represents an example situation in which an electrical path also serves as a thermal path. The thermal path 809, on the other hand, generally represents an example situation in which a high thermally conductive path is established to an available external electrical contact (e.g. electrical contact 811) that may also be used as a thermal contact, similar to the thermal contact 713 of FIG. 7. The thermal path 809 thus may be similar in structure and function to the thermal path 712. Embodiments of the invention that are in accordance with the layer transferred structure 700, therefore, can be applied to the structure 800 (and to semiconductor structures generally). Similarly, embodiments of the invention that are in accordance with the layer transferred structures 300, 400, 500 and 600 may be applied to semiconductor structures generally. The greater flexibility provided by decoupling the location of thermal contacts and electrical contacts provides advantageous results for semiconductor structures in general.

Some embodiments of the present invention can be described with reference to FIG. 9. FIG. 9 illustrates a layer transferred structure 900 generally comprising a semiconductor wafer 901 and a handle wafer 902 bonded together.

The semiconductor wafer 901 may be a conventional semiconductor-on-insulator (SOI) wafer or a conventional bulk semiconductor wafer. Additionally, although the semiconductor material of the semiconductor wafer 901 in many embodiments may be silicon, it is understood that the present invention is not necessarily so limited, but that other semiconductor materials (e.g. GaAs, SiC, GaN, InGaAs, InP, etc.) are generally within the scope of the present invention.

The semiconductor wafer 901 generally has an insulator layer 903 and an active layer 904. The active layer 904 is above the insulator layer 903. The active layer 904 generally includes an active device layer 905 and an interconnect layer 906. The active device layer 905 generally includes active semiconductor devices, such as transistors 907 and 908. The interconnect layer 906 generally includes electrically conductive traces 909 (e.g. metal wires and/or other types of electrical conductors) separated by dielectric materials. The conductive traces 909 may represent various different layers of any appropriate type(s) of electrically conductive materials. (Other layers or materials containing dielectrics, oxides, passivation layers, etc. may also be part of the semiconductor wafer 901, but are not shown for simplicity.)

The handle wafer 902 is located above the active layer 904. The handle wafer 902 generally has a bonding layer 910 and a substrate layer 911. The bonding layer 910 may be an oxide, adhesive or other appropriate material deposited, epitaxially grown or implanted in or on the handle wafer 902 for bonding the handle wafer 902 to the semiconductor wafer 901. The substrate layer 911 may be any appropriate semiconductor material, such as silicon, GaAs, SiC, GaN, InGaAs, InP, etc.

The layer transferred structure 900 also generally includes a thermal path 912 located below the handle substrate layer 911 and extending through the bonding layer 910 from the handle substrate layer 911 to the active layer 904. In some embodiments of the invention, the thermal path 912 may extend into the handle substrate layer 911 and may have a non-planar surface to increase the surface area of the connection between the thermal path 912 and the handle substrate layer 911.

As illustrated, the material that comprises the thermal path 912 terminates on a top layer of the conductive traces 909 in the interconnect layer 906. However, in alternative embodiments, the thermal path 912 may extend down into the active layer 904 and terminate on any layer of the conductive traces 909 or any other appropriate layer, such as the surface of active device layer 905.

In some embodiments of the invention, the thermal path 912 may consist of any high TC dielectric material. In other embodiments of the invention, the thermal path 912 may consist of any high TC material regardless of its dielectric constant and may terminate on dummy metal lines or any other layer of the active layer 904 for which the thermal path 912 does not have to be dielectric to avoid affecting nearby circuitry.

In some embodiments of the invention, the thermal path 912 provides a heat sink from active circuitry in the active layer 904 to the handle substrate 911. In some embodiments of the invention, the thermal path 912 provides a heat sink from the handle substrate 911 to thermal contacts below the exposed insulator layer 903. In these embodiments, the active layer 904 is configured to act as part of a thermal path and, alternatively or in combination, a thermal path is provided on, at or near the back side of the active layer 904.

Some embodiments of the present invention can be described with reference to FIG. 10. FIG. 10 illustrates a layer transferred structure 1000 generally comprising a semiconductor wafer 1001 and a handle wafer 1002 bonded together.

The semiconductor wafer 1001 may be a conventional semiconductor-on-insulator (SOI) wafer or a conventional bulk semiconductor wafer. Additionally, although the semiconductor material of the semiconductor wafer 1001 in many embodiments may be silicon, it is understood that the present invention is not necessarily so limited, but that other semiconductor materials (e.g. GaAs, SiC, GaN, InGaAs, InP, etc.) are generally within the scope of the present invention.

The semiconductor wafer 1001 generally has an insulator layer 1003 and an active layer 1004. The active layer 1004 is above the insulator layer 1003. The active layer 1004 generally includes an active device layer 1005 and an interconnect layer 1006. The active device layer 1005 generally includes active semiconductor devices, such as transistors 1007 and 1008. The interconnect layer 1006 generally includes electrically conductive traces 1009 (e.g. metal wires and/or other types of electrical conductors) separated by dielectric materials. The conductive traces 1009 may represent various different layers of any appropriate type(s) of electrically conductive materials. (Other layers or materials containing dielectrics, oxides, passivation layers, etc. may also be part of the semiconductor wafer 1001, but are not shown for simplicity.)

The handle wafer 1002 is located above the active layer 1004. The handle wafer 1002 generally has a bonding layer 1010 and a substrate layer 1011. The bonding layer 1010 may be an oxide, adhesive or other appropriate material deposited, epitaxially grown or implanted in or on the handle wafer 1002 for bonding the handle wafer 1002 to the semiconductor wafer 1001. The substrate layer 1011 may be any appropriate semiconductor material, such as silicon, GaAs, SiC, GaN, InGaAs, InP, etc.

The layer transferred structure 1000 also generally includes thermal paths 1012 and 1013, a back side external thermal contact 1014 and a redistribution conductor 1015. The thermal path 1012 is generally located below the handle substrate layer 1011 and extends through the bonding layer 1010 from the handle substrate layer 1011 to the active layer 1004. The thermal path 1013 extends through the insulator layer 1003 from the active layer 1004 to the thermal contact 1014. The thermal contact 1014 may have any of the characteristics discussed with reference to the thermal contacts 612 and 713.

In some embodiments of the invention, the thermal paths 1012 and 1013 may consist of any high TC dielectric material. Additionally, the thermal path 1012 may take on any of the characteristics discussed above with reference to the thermal path 912.

In some embodiments of the invention, the thermal path 1012 may terminate on the top surface of the interconnect layer 1006 as shown. In this case, the thermal path 1012 generally contacts a top layer of thermally and/or electrically conductive material, such as a stack of the conductive traces 1009. The thermal path 1012 thus generally provides a high TC path for heat from the interconnect layer 1006 to transfer through the bonding layer 1010 to the handle substrate layer 1011.

In some embodiments of the invention, the thermal path 1013 may terminate on the bottom surface of the active device layer 1005 as shown. In this case, the thermal path 1013 generally provides a high TC path for heat generated in the active device layer 1005 to transfer to the thermal contact 1014.

In some embodiments of the invention, the thermal path 1012 and/or 1013 may extend into the active layer 1004. In variations on such embodiments, the thermal paths 1012 and 1013 may extend through the entire active layer 1004 such that they become a single continuous thermal path, such as thermal path 1101 through layer transferred structure 1100 in FIG. 11, described below. In this case, the thermal paths 1012 and 1013 may act in combination to provide a heat sink for heat from the handle substrate layer 1011 or from any location within the active layer 1004 to exit the structure 1000 through a contact such as the thermal contact 1014. Additionally, in some embodiments of the invention, thermal paths such as 1012 and 1013 may act in combination with other thermal paths, such as thermal path 412 (FIG. 4) to provide a heat sink for circuitry in the active layer 404 or 1004 to a thermal contact such as the thermal contact 1014.

Figure 11:
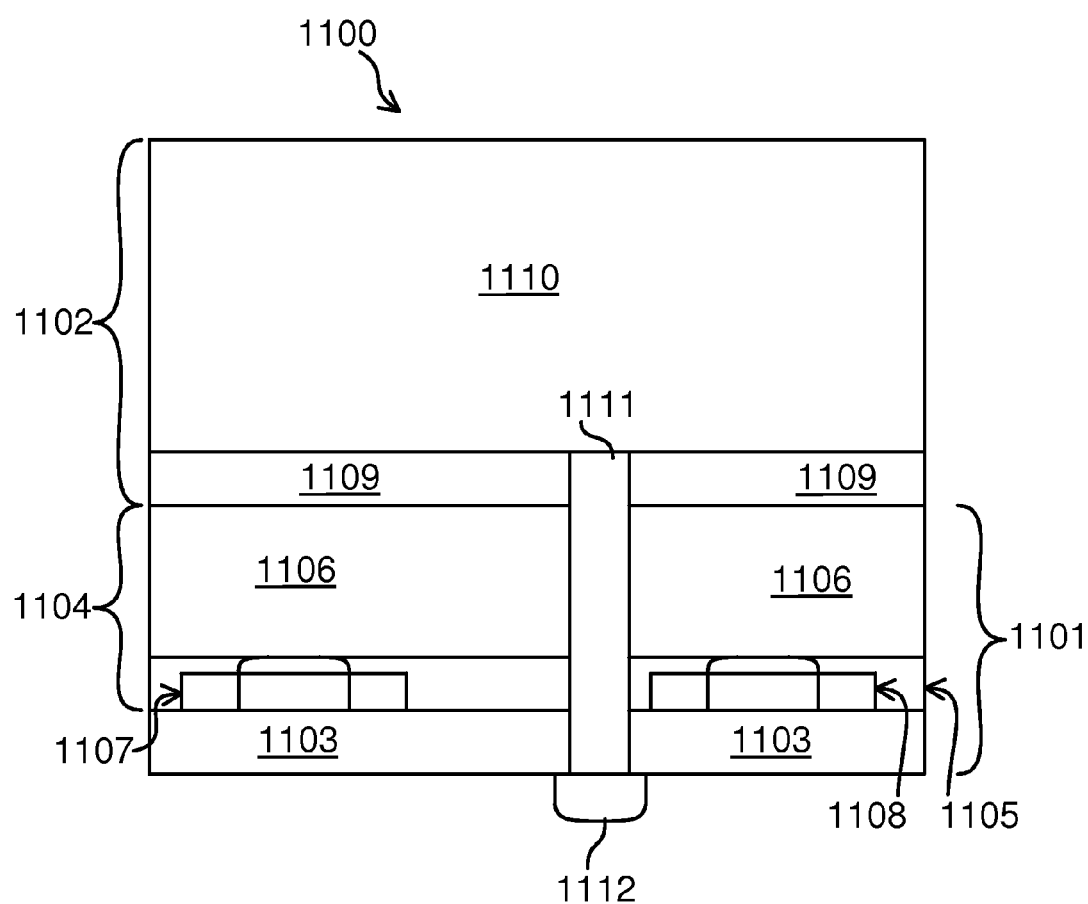

Some embodiments of the present invention can be described with reference to FIG. 11. FIG. 11 illustrates a layer transferred structure 1100 generally comprising a semiconductor wafer 1101 and a handle wafer 1102 bonded together.

The semiconductor wafer 1101 may be a conventional semiconductor-on-insulator (SOI) wafer or a conventional bulk semiconductor wafer. Additionally, although the semiconductor material of the semiconductor wafer 1101 in many embodiments may be silicon, it is understood that the present invention is not necessarily so limited, but that other semiconductor materials (e.g. GaAs, SiC, GaN, InGaAs, InP, etc.) are generally within the scope of the present invention.

The semiconductor wafer 1101 generally has an insulator layer 1103 and an active layer 1104. The active layer 1104 is above the insulator layer 1103. The active layer 1104 generally includes an active device layer 1105 and an interconnect layer 1106. The active device layer 1105 generally includes active semiconductor devices, such as transistors 1107 and 1108. The interconnect layer 1106 generally includes electrically conductive traces (e.g. metal wires and/or other types of electrical conductors, not shown) separated by dielectric materials. The conductive traces may represent various different layers of any appropriate type(s) of electrically conductive materials. (Other layers or materials containing dielectrics, oxides, passivation layers, etc. may also be part of the semiconductor wafer 1101, but are not shown for simplicity.)

The handle wafer 1102 is located above the active layer 1104. The handle wafer 1102 generally has a bonding layer 1109 and a substrate layer 1110. The bonding layer 1109 may be an oxide, adhesive or other appropriate material deposited, epitaxially grown or implanted in or on the handle wafer 1102 for bonding the handle wafer 1102 to the semiconductor wafer 1101. The substrate layer 1110 may be any appropriate semiconductor material, such as silicon, GaAs, SiC, GaN, InGaAs, InP, etc.

The layer transferred structure 1100 also generally includes a thermal path 1111 and a back side external thermal contact 1112. The thermal path 1111 is generally located below the handle substrate layer 1110 and extends through the bonding layer 1109, the active layer 1104 and the insulator layer 1103 from the handle substrate layer 1110 to the thermal contact 1112. The thermal contact 1112 may have any of the characteristics discussed with reference to the thermal contacts 612 and 713.

In some embodiments of the invention, the thermal path 1111 extending through the active layer 1104 can take on any of the characteristics of the thermal paths 312, 313, 412 or 513 extending through the active layer 304, 404 or 504 discussed with reference to FIGS. 3, 4 and 5 above. In general, the thermal path 1111 provides a heat sink between the handle substrate layer 1110 and the thermal contact 1112. Additionally, the thermal path 1111 may dissipate heat to either the handle substrate layer 1110 or the thermal contact 1112 from any components with which it is in thermal contact within the active layer 1104.

Figure 12:
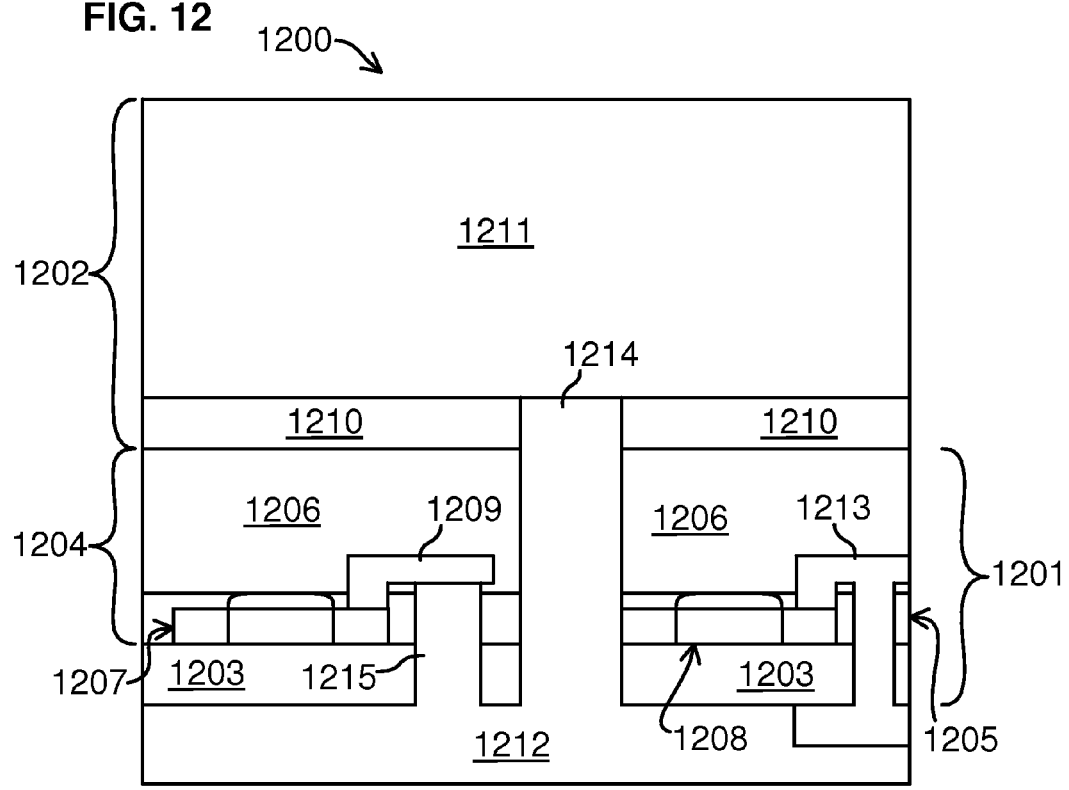

Some embodiments of the present invention can be described with reference to FIG. 12. FIG. 12 illustrates a layer transferred structure 1200 generally comprising a semiconductor wafer 1201 and a handle wafer 1202 bonded together.

The semiconductor wafer 1201 may be a conventional semiconductor-on-insulator (SOI) wafer or a conventional bulk semiconductor wafer. Additionally, although the semiconductor material of the semiconductor wafer 1201 in many embodiments may be silicon, it is understood that the present invention is not necessarily so limited, but that other semiconductor materials (e.g. GaAs, SiC, GaN, InGaAs, InP, etc.) are generally within the scope of the present invention.

The semiconductor wafer 1201 generally has an insulator layer 1203 and an active layer 1204. The active layer 1204 is above the insulator layer 1203. The active layer 1204 generally includes an active device layer 1205 and an interconnect layer 1206. The active device layer 1205 generally includes active semiconductor devices, such as transistors 1207 and 1208. The interconnect layer 1206 generally includes electrically conductive traces 1209 (e.g. metal wires and/or other types of electrical conductors) separated by dielectric materials. The conductive traces 1209 may represent various different layers of any appropriate type(s) of electrically conductive materials. (Other layers or materials containing dielectrics, oxides, passivation layers, etc. may also be part of the semiconductor wafer 1201, but are not shown for simplicity.)

The handle wafer 1202 is located above the active layer 1204. The handle wafer 1202 generally has a bonding layer 1210 and a substrate layer 1211. The bonding layer 1210 may be an oxide, adhesive or other appropriate material deposited, epitaxially grown or implanted in or on the handle wafer 1202 for bonding the handle wafer 1202 to the semiconductor wafer 1201. The substrate layer 1211 may be any appropriate semiconductor material, such as silicon, GaAs, SiC, GaN, InGaAs, InP, etc.

The layer transferred structure 1200 also generally includes a thermal path 1212 and a redistribution conductor 1213. The redistribution conductor 1213 may be thermally conductive (and optionally electrically conductive) material that generally extends from the interconnect layer 1206 to below the insulator layer 1203. In some embodiments, an upper portion of the redistribution conductor 1213 may be formed along with structures in the active device layer 1205 and the interconnect layer 1206 using the same processes and materials to form these structures, as long as the materials are highly thermally conductive. A lower portion of the redistribution conductor 1213 may be formed during back side processing after the wafers 1201 and 1202 have been bonded and an underlying substrate layer of the semiconductor wafer 1201 has been removed or thinned.

The thermal path 1212 is generally disposed on the back side of the structure 1200. Thermal path 1212 may take on any of the configurations or compositions discussed above with reference to the thermal paths 313, 611, 712, 1013 and 1111. The thermal path 1212 is shown covering an entire back side of the semiconductor wafer 1201. However, it is understood that in some embodiments the thermal path 1212 may not necessarily cover the entire back side of the semiconductor wafer 1201, but only portions thereof, including a substantial portion thereof. Additionally, in some locations, the thermal path 1212 extends into the semiconductor wafer 1201 and even into the handle wafer 1202 where desired.

A portion of the thermal path 1212 may be disposed in a trench 1214 formed through the insulator layer 1203, the active layer 1204 and the bonding layer 1210, so that the thermal path 1212 is in contact with the active layer 1204 and the handle substrate layer 1211. In some embodiments of the invention, the trench 1214 (or a plurality thereof) may cover some or all field regions of the structure 1200. Additionally, in some embodiments of the invention, the trench 1214 may be laterally coextensive with a majority of a plan-view area of the structure 1200. The portion of the thermal path 1212 within the trench 1214 is, therefore, an example of a thermal path that may conduct heat from almost any location within the structure 1200 to the back side thereof.

The redistribution conductor 1213 is in contact with the thermal path 1212 on the back side of the semiconductor wafer 1201. This configuration is, thus, an example of the thermal path 1212 being used in combination with other thermally conductive materials (e.g. the redistribution conductor 1213) that conduct heat from the active layer 1204 down through the insulator layer 1203. The thermal path 1212, therefore, may be used in combination with any form of back side conductive routing lines described above.

Another portion of the thermal path 1212 may be disposed in an exposed region or another trench 1215. The trench 1215 generally allows contact up through the insulator layer 1203 and the active device layer 1205 to the conductive traces 1209 in the interconnect layer 1206 regardless of whether or not the conductive traces 1209 at that point are being used to route a signal outside the active layer 1204. The portion of the thermal path 1212 within the trench 1215 is, therefore, an example of a thermal path that may conduct heat from an intermediate location within the structure 1200 to the back side thereof. In some embodiments, the trench 1214 or 1215 may be formed through the active device layer 1205 and at least partway to the handle substrate layer 1211.

Some embodiments of the invention can be described with reference to FIG. 13. FIG. 13 displays a layer transferred structure 1300 generally comprising a semiconductor wafer 1301 and a handle wafer 1302 bonded together.

The semiconductor wafer 1301 may be a conventional semiconductor-on-insulator (SOI) wafer or a conventional bulk semiconductor wafer. Additionally, although the semiconductor material of the semiconductor wafer 1301 in many embodiments may be silicon, it is understood that the present invention is not necessarily so limited, but that other semiconductor materials (e.g. GaAs, SiC, GaN, InGaAs, InP, etc.) are generally within the scope of the present invention.

The semiconductor wafer 1301 generally has insulator layers 1303 and 1304, an interconnect layer 1305, an active device layer 1306 and an overlying layer 1307. The active device layer 1306 generally includes active semiconductor devices, such as transistors 1308 and 1309. The interconnect layer 1305 generally includes electrically conductive traces 1310 (e.g. metal wires and/or other types of electrical conductors) separated by dielectric materials. (Other layers or materials containing dielectrics, oxides, passivation layers, etc. may also be part of the semiconductor wafer 1301, but are not shown for simplicity.)

The handle wafer 1302 generally has a bonding layer 1311 and a substrate layer 1312. The bonding layer 1311 may be an oxide, adhesive or other appropriate material deposited, epitaxially grown or implanted in or on the handle wafer 1302 for bonding the handle wafer 1302 to the semiconductor wafer 1301. The substrate layer 1312 may be any appropriate semiconductor material, such as silicon, GaAs, SiC, GaN, InGaAs, InP, etc. Additionally, the bonding layer 1311 and the substrate layer 1312 may be highly thermally conductive.

The conductive traces 1310 may represent various different layers of any appropriate type(s) of electrically conductive materials. The conductive traces 1310 are, therefore, a primary routing system of electrical interconnects below the active device layer 1306.

The overlying layer 1307 is generally a combination of poly-silicon remaining over devices (e.g. the transistors 1308 and 1309) formed in the active device layer 1306 and a low-stress high TC dielectric that may have been planarized with CMP and bonded to the bonding layer 1311 of the handle wafer 1302. In some embodiments of the invention, the poly-silicon remaining over the source and drain in the overlying layer 1307 may be electrically tied to the active semiconductor material in the active device layer 1306 using buried contacts. This poly-silicon may also either be left floating or be contacted outside of the active device layer 1306 with conductive interconnects extending through the active device layer 1306. In some embodiments of the invention, the poly-silicon in the overlying layer 1307 is left covering only gate material of the devices (e.g. the transistors 1308 and 1309) in the active device layer 1306. This poly-silicon generally forms gate poly-silicon for the transistors 1308 and 1309 in the active device layer 1306. In some embodiments of the invention, the overlying layer 1307 comprises poly-silicon deposited over the source, drain, and gate regions of the transistors 1308 and 1309 in the active device layer 1306 and a layer of low dielectric constant material, such as SiO2 deposited and planarized with the poly-silicon such that there is a low dielectric constant material between the poly-silicon lines and the high TC material at the top of the overlying layer 1307. These embodiments generally exhibit advantageous aspects because the low dielectric constant material generally reduces capacitance between the poly-silicon lines while it also keeps thermal resistance between the active device layer 1306 and the handle wafer 1302 relatively low.

Embodiments of the invention that are in accordance with the structure 1300 generally exhibit excellent thermal performance since the active device layer 1306 has a relatively short and wide thermal path (i.e. the overlying layer 1307 and the bonding layer 1311) directly to the handle substrate layer 1312 regardless of the number of metal layers in the structure 1300. In addition, thermal paths can be provided through the conductive traces 1310 of the interconnect layer 1305 to back side thermal contacts, such as a back side external thermal contact 1313. The characteristic of these thermal paths may be similar to that described above with reference to any of the aforementioned thermal paths, as appropriate.

FIG. 14 shows a flowchart for a process 1400 for fabricating at least part of an integrated circuit chip having a thermal path from the active device layer to a handle wafer of a layer transferred structure (e.g. similar to structure 300, 400 or 500 of FIG. 3, 4 or 5), according to some embodiments of the present invention. It is understood, however, that the specific process 1400 is shown for illustrative purposes only and that other embodiments (in addition to specifically mentioned alternative embodiments) may involve other processes or multiple processes with other individual steps or a different order or combination of steps and still be within the scope of the present invention.

Upon starting at 1401, the active layer 304, 404 or 504 of the semiconductor wafer 301, 401 or 501 is processed (at 1402) using standard semiconductor processing techniques. In other words, the active layer 304, 404 or 504 is formed to produce a circuit with a set of active devices in the semiconductor wafer 301, 401 or 501. For an SOI wafer, the active layer 304, 404 or 504 may be manufactured using a standard SOI process. For a bulk semiconductor wafer, the active layer 304, 404 or 504 may be formed with a process that provides an etch stop for a subsequent substrate removal, such as a P+ layer formed below the active device layer 305, 405 or 505. Additionally, a chemical mechanical polishing is optionally performed on the top surface of the semiconductor wafer 301, 401 or 501.

As part of this processing, a dummy metal stack such as that described with reference to the thermal path 412 can be built in the active layer 304, 404 or 504 to form the thermal path 312, 313, 412 or 513. Alternatively or in combination, the active layer 304, 404 or 504 can be built up completely and a trench can be etched into the active layer 304, 404 or 504 and then filled with a high TC dielectric material to form (at 1403) the thermal path 312, 313, 412 or 513.

The top side bonding material (not shown) of the semiconductor wafer 301, 401 or 501 may be formed (at 1404) by various processing steps. In some embodiments of the invention, the bonding material can be completely removed using a technique such as chemical-mechanical polishing and be replaced by a deposited layer of high TC dielectric material, such as un-doped poly-silicon that is in direct contact with the top of the interconnect layer 306, 406 or 506. Alternatively, the bonding material can be removed in a pattern to form an excavated region and a layer of high TC dielectric material can be placed in the excavated region or across the entire top surface of the semiconductor wafer 301, 401 or 501. The top side of the semiconductor wafer 301, 401 or 501 can then be subjected to chemical mechanical polishing (CMP) leaving behind a planarized layer of the recently deposited high TC dielectric material or a combination of the original bonding material and the recently deposited high TC dielectric material that has been ground down to be even with the surface of the original bonding material.

The handle wafer 302, 402 or 502 is then bonded (at 1405) to the semiconductor wafer 301, 401 or 501. The bonding may be a direct Si—Si bond, a direct oxide-oxide bond, an adhesive bond, an anodic bond, a low-temperature glass frit bond, a molecular bond, an electrostatic bond, etc., as appropriate for a given situation. The two wafers 301, 401 or 501 and 302, 402 or 502 can be bonded using a direct Si—Si bond if the top side bonding material of the semiconductor wafer 301, 401 or 501 is comprised of poly-silicon and the bonding layer 310, 410 or 511 is absent or comprised of polysilicon.

Once the handle wafer 302, 402 or 502 is bonded to the semiconductor wafer 301, 401 or 501, the original underlying, or back side, portion (e.g. a semiconductor substrate) of the semiconductor wafer 301, 401 or 501 is substantially removed or thinned (at 1406). Most of the semiconductor substrate can be removed by back side grinding. A final portion of the semiconductor substrate can be removed by a wet etch, selective chemical mechanical polishing (CMP), a dry etch, etc., leaving at least the active device layer 306, 406 or 506 (or the insulator layer 303, 403 or 503, if it is part of the original semiconductor wafer 301, 401 or 501). For embodiments using a bulk semiconductor wafer, the original underlying substrate is removed to a previously formed P+ layer using a wet chemical etch that is highly selective to P+ material (for example EDP, KOH, or TMAH). The etch can be either chemical or electro-chemical. Additionally, the P+ layer is optionally removed using any combination of grinding, polishing, CMP, dry etch, or non-selective wet etch. The P+ layer will only be a few microns in thickness, so a much better uniformity of a remaining relatively thin (e.g. less than 1 μm) semiconductor film can be achieved than if the semiconductor wafer 301, 401 or 501 was thinned mechanically. Furthermore, after removing/thinning the various layers or materials at 1406, a passivation dielectric layer(s) is optionally deposited on the newly-exposed surface to reduce effects due to moisture and ionic contamination ingress.

At 1407, patterned contact and metallization are formed for any top or back side connections (e.g. top or bottom electrodes and contacts, etc., as desired). At 1408, various passivation deposition techniques are performed and pad openings are formed, so the overall IC chip can be generally completed with bumps, pillars, or other post-processing metallization. The process 1400 then ends at 1409.

Various lateral and vertical patterns of thermal path can be formed using masked etching. These processes may be carried out prior to the layer transfer at 1405. Masked etching can be used to remove material to form the desired lateral patterns described above. Variant vertical patterns can be formed using an etch stop layer such as the etch stop layer 514. An etch stop layer such as the etch stop layer 514 can be used to form the desired vertical patterns described above. The etch stop layer 514 can be comprised of any material that has a slower etch rate as compared to the isolation material in the metallization layers of the interconnect layer 306, 406 or 506. For example, Si3N4 can be used as the etch stop layer 514 if the isolation material in the interconnect layer 306, 406 or 506 is SiO2.

FIG. 15 shows a flowchart for a process 1500 for fabricating at least part of an integrated circuit chip having a thermal path from an active layer through an insulator layer of a layer transferred or non-layer-transferred structure (e.g. similar to structure 600, 700 or 800 of FIG. 6, 7 or 8), according to some embodiments of the present invention. It is understood, however, that the specific process 1500 is shown for illustrative purposes only and that other embodiments (in addition to specifically mentioned alternative embodiments) may involve other processes or multiple processes with other individual steps or a different order or combination of steps and still be within the scope of the present invention.

Upon starting at 1501, the semiconductor wafer 601, 701 or 801 is processed (at 1502) according to standard semiconductor processing techniques to form the active layer 604, 704 or 804. In other words, the active layer 604, 704 or 804 is formed to produce a circuit with a set of active devices in the semiconductor wafer 601, 701 or 801. In some embodiments, the process 1500 can begin using an SOI wafer having a thin buried oxide layer. For an SOI wafer, the active layer 604, 704 or 804 may be manufactured using a standard SOI process. For a bulk semiconductor wafer, the active layer 604, 704 or 804 may be formed with a process that provides an etch stop for a subsequent substrate removal, such as a P+ layer formed below the active device layer 605, 705 or 805. Additionally, a chemical mechanical polishing is optionally performed on the top surface of the semiconductor wafer 601, 701 or 801.

For some embodiments in accordance with FIGS. 6 and 7, the processing at 1502 may optionally include forming the portion of the thermal path 611 or 712 that is disposed within the active device layer 605 or 705. Additionally, for some embodiments in accordance with FIG. 8, the processing at 1502 may generally include forming the entire, or almost the entire, thermal path 809 within the active layer 804. In some alternative embodiments in accordance with FIG. 8, the formation of the thermal path 809 is generally performed (at 1503) after the rest of the active layer 804 is formed. In this case, a trench is etched through the interconnect layer 806 (and optionally through at least a portion of the active device layer 805), followed by filling the trench with a highly TC material (dielectric or conductive, as needed) to form the thermal path 809.

For embodiments in accordance with FIGS. 6 and 7, a top side bonding material (not shown) for the semiconductor wafer 601 or 701 may be formed (at 1504) by various processing steps, e.g. similar to that described above for 1404 (FIG. 14). The handle wafer 602 or 702 is then bonded (at 1505) to the semiconductor wafer 601 or 701. The bonding may be a direct Si—Si bond, a direct oxide-oxide bond, an adhesive bond, an anodic bond, a low-temperature glass frit bond, a molecular bond, an electrostatic bond, etc., as appropriate for a given situation.

For embodiments in accordance with FIGS. 6 and 7, the original underlying, or back side, portion (e.g. a semiconductor substrate) of the semiconductor wafer 601 or 701 is substantially removed or thinned (at 1506), e.g. similar to that described above for 1406 (FIG. 14). Optionally, the insulator layer 603 or 703 can also undergo a uniform thinning process.

The insulator layer 603 or 703 (and any passivation) is etched (at 1507) to form an excavation area for the thermal path 611 or 712. Alternatively, if the processing at 1502 did not include forming the portion of the thermal path 611 or 712 that is disposed within the active device layer 605 or 705, the active device layer 605 or 705 can also be etched (at 1507) to form deeper thermal path excavation areas. Optionally, the top of the excavation areas may undergo an etch that roughens the surface to increase the surface area of the contact between the etched surface and the subsequently deposited high TC material. The high TC material is then deposited (at 1508) in the thermal path excavation areas to form the thermal path 611 or 712 and can alternatively also be planarized.

The procedure 1500 may continue (at 1509) with the production of back side electrical contacts for embodiments in accordance with FIGS. 6 and 7 and front side electrical contacts for embodiments in accordance with FIG. 8. At 1510, a passivation layer may be deposited to form a barrier against contamination. Additionally, for embodiments in accordance with FIGS. 6 and 7, the insulator layer 603 or 703 may be etched back to form pad openings that expose metal interconnect. Standard metal contact processing may also be performed. Alternatively, the standard metal contact processing can be preceded by first depositing redistribution metal on the back side of the layer transferred structure 600 or 700 or the front side of the structure 800 to connect the pad openings to the surface of the thermal path 611, 712 or 809. Standard metal contact processing places bump metal or other contact metal (e.g. contact 612, 713 or 811) on the back side of the structure 600 or 700 or the front side of the structure 800. In some embodiments of the invention, the contact metal will be placed over the redistribution metal that covers the surface of the thermal path 611, 712 or 809. The process 1500 then ends at 1511.

Some embodiments for forming the thermal path 912 in accordance with FIG. 9 may generally use variations of the process 1400 described above with reference to FIG. 14. Additionally, some embodiments for forming the thermal path 1111 in accordance with FIG. 11 may generally use variations of the process 1500 described above with reference to FIG. 15 in which the etch at 1507 generally goes all the way to the handle wafer 1102. However, some embodiments for forming the thermal path 1012, 1013 or 1111 between the handle substrate 1011 or 1110 and the back side of the layer transferred structure 1000 or 1100 in accordance with FIG. 10 or 11 may generally combine variations of the processes 1400 and 1500. The process 1400, for example, generally creates the thermal path 312, 313, 412 or 513 or portions thereof (at 1403) between any portion of the active layer 304, 404 or 504 and the handle wafer 302, 402 and 502 before layer transfer is performed (i.e. the wafer bonding at 1405). Variations of the process 1400, therefore, may generally create the thermal path 912 or 1012 (optionally including any appropriate portions or layers of the conductive traces 909 or 1009) or at least an upper portion of the thermal path 1111 between any portion of the active layer 904, 1004 or 1104 and the handle wafer 902, 1002 and 1102 before layer transfer is performed. After layer transfer (i.e. the wafer bonding at 1505), on the other hand, the process 1500 generally forms the thermal path 611 or 712 (at 1507 and 1508) between the back side of the structure 600 or 700 and the active layer 604 and 704. After layer transfer, therefore, variations of the process 1500 may generally form the thermal path 1013 or at least a lower portion of 1111 between the back side of the structure 1000 or 1100 and the active layer 1004 and 1104.

Embodiments of the invention that are in accordance with FIG. 12 may generally be produced using variations of the process 1500 described above. After semiconductor processing, wafer bonding and removal/thinning of the underlying substrate of the semiconductor wafer 1201 (e.g. after 1506), a pattern can be etched (e.g. at 1507) in the back side of the structure 1200. This etching step can remove material all the way to and into the back surface of the handle substrate layer 1211 (e.g. forming the trenches 1214 and 1215). The thermal path 1212 may then be deposited on the back side of the structure 1200 in a single deposition step (e.g. at 1508).

FIG. 16 shows a flowchart for a process 1600 for fabricating at least part of an integrated circuit chip having a principle routing system of metal interconnects below an active layer in accordance with FIG. 13. It is understood, however, that the specific process 1600 is shown for illustrative purposes only and that other embodiments (in addition to specifically mentioned alternative embodiments) may involve other processes or multiple processes with other individual steps or a different order or combination of steps and still be within the scope of the present invention.

Upon starting at 1601, the semiconductor wafer 1301 is processed (at 1602) to form the active device layer 1306, including implanting dopant in source and drain areas that will be contacted from the bottom. These areas may be covered by poly-silicon, which generally blocks implants from reaching the source and drain areas. Thus, a low-resistance contact to the source and drain areas is established. The implants may be spaced away from the gate polysilicon so that later source and drain implants may be self-aligned to the gate edge. After gate formation, poly-silicon generally remains over the source and drain areas as well as the gate areas.

A low-stress high TC dielectric is deposited (at 1603) on the top surface of the semiconductor wafer 1301 and planarized with CMP. Optionally, a low dielectric constant material such as SiO2 is also deposited and planarized with CMP to be even with the remaining poly-silicon before the high TC dielectric is deposited.

The semiconductor wafer 1301 is bonded (at 1604) to the handle wafer 1302 with a high TC material in a combination Si—SiO2 and Si—Si direct bond. The bonding may alternatively be a direct oxide-oxide bond, an adhesive bond, an anodic bond, a low-temperature glass frit bond, a molecular bond, an electrostatic bond, etc., as appropriate for a given situation.

The underlying substrate of the semiconductor wafer 1301 is removed or thinned at 1605, e.g. similar to 1406 or 1506 above. The interconnect layer 1305 is then built (at 1606) below the insulator layer 1304. At 1607, patterned contact and metallization are formed for any external connections, as desired, including the thermal contact 1313, e.g. similar to contact 315, 612, 1014 or 1112. At 1608, various passivation deposition techniques are performed and pad openings are formed, so the overall IC chip can be generally completed with bumps, pillars, or other post-processing metallization. The process 1600 then ends at 1609.

Although embodiments of the invention have been discussed primarily with respect to specific embodiments thereof, other variations are possible. Various configurations of the described system may be used in place of, or in addition to, the configurations presented herein. For example, most examples above were explained with reference to layer transferred structures, but some of the teachings of the present invention apply equally well to standard non-layer-transferred semiconductor structures. Also, additional layers of passivation and insulation may be disposed in-between described layers where appropriate. In addition, thermal paths have been drawn and their vertical patterns relative to the semiconductor structure have been emphasized. However, the lateral pattern of the thermal paths may take on very important characteristics. For example, the thermal paths may be disposed only in field regions or may be disposed such that they are laterally coextensive with specific regions where heat generation is a major concern. The lateral pattern may also consist of a pad ring or some other circuit structure. Different lateral patterns may also be combined with differing vertical patterns. For example, the thermal paths may be disposed on the back side of the active layer in regions having active circuitry while extending to deeper layers within the active layer in field regions.

Those skilled in the art will appreciate that the foregoing description is by way of example only, and is not intended to limit the invention. Nothing in the disclosure should indicate that the invention is limited to systems that are implemented on a single wafer. Nothing in the disclosure should indicate that the invention is limited to systems that require a particular form of semiconductor processing or integrated circuits. Nothing in the disclosure should limit the invention to semiconductor devices based on silicon. In general, any diagrams presented are only intended to indicate one possible configuration, and many variations are possible. Those skilled in the art will also appreciate that methods and systems consistent with the present invention are suitable for use in a wide range of applications encompassing any related to heat dissipation in semiconductor structures.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims.

What is claimed is:

1. A method comprising:
   forming an active device layer in a semiconductor wafer;
   bonding a handle wafer to a top side of the semiconductor wafer; and
   forming a thermal path in the semiconductor wafer, the thermal path being in contact with the active device layer.

2. The method of claim 1, further comprising:
   forming the thermal path at least partway to a substrate layer of the handle wafer.

3. The method of claim 2, further comprising:
   forming a back side external thermal contact on the semiconductor wafer; and forming a second thermal path from the back side external thermal contact at least partway to the substrate layer of the handle wafer.

4. The method of claim 2, further comprising:
   forming a back side external thermal contact on the semiconductor wafer; and forming the thermal path in contact with the back side external thermal contact.

5. The method of claim 1, further comprising:
   forming a back side external thermal contact on the semiconductor wafer; and forming the thermal path to the back side external thermal contact.

6. The method of claim 1, further comprising:
   forming the thermal path before the bonding of the handle wafer to the semiconductor wafer.

7. The method of claim 1, further comprising:
   forming the thermal path after the bonding of the handle wafer to the semiconductor wafer.

8. The method of claim 7, wherein:
   the handle wafer comprises a substrate layer; and
   the thermal path extends from the active device layer to the substrate layer.

9. The method of claim 5, wherein:
   the back side external thermal contact covers a substantial portion of a back side of the semiconductor wafer.

10. The method of claim 7, further comprising:
    etching a back side of the semiconductor wafer to form an excavation area for the thermal path.

11. The method of claim 5, wherein:
    a single deposition step forms both the back side external thermal contact and a portion of the thermal path, the portion of the thermal path being in contact with the active device layer.

12. The method of claim 7, further comprising:
    forming a back side external thermal contact on the semiconductor wafer; and
    forming the thermal path to the back side external thermal contact.

13. The method of claim 12, wherein:
    the thermal path is formed of material that is not electrically conductive.

14. The method of claim 12, wherein:
    the back side external thermal contact covers a substantial portion of a back side of the semiconductor wafer.

15. The method of claim 14, wherein:
    the handle wafer comprises a substrate layer; and
    the thermal path extends from the active device layer to the substrate layer.

16. The method of claim 1, further comprising:
    forming a back side external thermal contact on the semiconductor wafer; and
    forming a second thermal path extending from the back side external thermal contact to a substrate layer of the handle wafer;
    wherein the back side external thermal contact is a part of the thermal path, the active device layer is in an active layer of the semiconductor wafer, and the thermal path terminates in the active layer.

* * * * *